United States Patent
Nakai

(10) Patent No.: US 10,755,950 B2
(45) Date of Patent: Aug. 25, 2020

(54) SUBSTRATE PROCESSING APPARATUS

(71) Applicant: SCREEN Holdings Co., Ltd., Kyoto (JP)

(72) Inventor: Hitoshi Nakai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 602 days.

(21) Appl. No.: 15/544,459

(22) PCT Filed: Jan. 7, 2016

(86) PCT No.: PCT/JP2016/050310
§ 371 (c)(1),
(2) Date: Jul. 18, 2017

(87) PCT Pub. No.: WO2016/117363
PCT Pub. Date: Jul. 28, 2016

(65) Prior Publication Data
US 2018/0012778 A1 Jan. 11, 2018

(30) Foreign Application Priority Data

Jan. 20, 2015 (JP) .................................. 2015-008592

(51) Int. Cl.
*H01L 21/67* (2006.01)
*B08B 3/02* (2006.01)
(Continued)

(52) U.S. Cl.
CPC .......... *H01L 21/67023* (2013.01); *B08B 3/02* (2013.01); *B08B 3/08* (2013.01);
(Continued)

(58) Field of Classification Search
None
See application file for complete search history.

(56) References Cited

U.S. PATENT DOCUMENTS

2003/0183250 A1* 10/2003 Rodney Chiu ........... B08B 3/02
 134/30
2004/0118676 A1* 6/2004 Mizohata ............... C25D 21/12
 204/193
(Continued)

FOREIGN PATENT DOCUMENTS

JP 2010-010251 A 1/2010
JP 2010-10421 A 1/2010
(Continued)

OTHER PUBLICATIONS

PCT/IB/326 Notification Concerning Transmitaal of International Preliminary Report on Patentability including PCT/IB/373 and PCT/ISA/237 (in Japanese) dated Aug. 3, 2017 for International Application No. PCT/JP2016/050310.
(Continued)

*Primary Examiner* — Jethro M. Pence
(74) *Attorney, Agent, or Firm* — Ostrolenk Faber LLP

(57) ABSTRACT

In a substrate processing apparatus, a cup part is moved in an up-down direction to cause a cup exhaust port to selectively overlap a first chamber exhaust port or a second chamber exhaust port. In the state in which the cup exhaust port overlaps the first chamber exhaust port, gas in the cup part is discharged through the cup exhaust port and the first chamber exhaust port by a first exhaust mechanism. In the state in which the cup exhaust port overlaps the second chamber exhaust port, the gas in the cup part is discharged through the cup exhaust port and the second chamber exhaust port by a second exhaust mechanism. In this way, an exhaust mechanism for exhausting gas from the cup part can be easily switched between the first exhaust mechanism and the second exhaust mechanism.

16 Claims, 18 Drawing Sheets

(51) Int. Cl.
*B08B 3/08* (2006.01)
*B08B 3/10* (2006.01)
*H01L 21/02* (2006.01)
*H01L 21/306* (2006.01)
*H01L 21/687* (2006.01)

(52) U.S. Cl.
CPC .......... *B08B 3/10* (2013.01); *H01L 21/02057* (2013.01); *H01L 21/30604* (2013.01); *H01L 21/67051* (2013.01); *H01L 21/68764* (2013.01); *B08B 2203/0229* (2013.01)

(56) References Cited

U.S. PATENT DOCUMENTS

| | | | | |
|---|---|---|---|---|
| 2004/0140199 | A1* | 7/2004 | Mizohata | C25D 5/04 204/212 |
| 2006/0068093 | A1* | 3/2006 | Shite | G03F 7/162 427/240 |
| 2008/0305434 | A1* | 12/2008 | Nishi | G03F 7/26 430/296 |
| 2009/0320885 | A1 | 12/2009 | Inoue et al. | 134/104.2 |
| 2010/0243168 | A1 | 9/2010 | Nakano et al. | 156/345.54 |
| 2011/0073040 | A1 | 3/2011 | Hashimoto | 118/728 |
| 2012/0171941 | A1 | 7/2012 | Matsuzawa | 454/56 |
| 2012/0260946 | A1 | 10/2012 | Ogata et al. | 134/18 |
| 2013/0008872 | A1 | 1/2013 | Higashuima et al. | 216/92 |
| 2013/0092195 | A1* | 4/2013 | Takimoto | H01L 21/67276 134/26 |
| 2013/0152976 | A1* | 6/2013 | Amano | H01L 21/67051 134/26 |
| 2013/0156948 | A1* | 6/2013 | Amano | H01L 21/67051 427/240 |
| 2013/0269737 | A1* | 10/2013 | Mizuno | H01L 21/02041 134/157 |
| 2014/0026927 | A1 | 1/2014 | Ogata et al. | 134/104.2 |
| 2014/0060423 | A1* | 3/2014 | Nakai | B05C 11/1039 118/50 |
| 2014/0261172 | A1 | 9/2014 | Ito | 118/712 |
| 2014/0352730 | A1* | 12/2014 | Kai | C03C 23/0075 134/22.11 |
| 2015/0059642 | A1* | 3/2015 | Furuya | H01L 21/67028 118/52 |

FOREIGN PATENT DOCUMENTS

| | | |
|---|---|---|
| JP | 2010-010555 A | 1/2010 |
| JP | 2010-226043 A | 10/2010 |
| JP | 2012-146835 A | 8/2012 |
| JP | 2014-41994 A | 3/2014 |
| KR | 10-0864647 A | 10/2008 |
| KR | 10-2013-0006349 A | 1/2013 |
| KR | 10-2014-0111953 A | 9/2014 |
| TW | 201108350 A1 | 3/2011 |
| TW | 201125062 A1 | 7/2011 |
| TW | 201234457 A1 | 8/2012 |
| TW | 201312678 A1 | 3/2013 |

OTHER PUBLICATIONS

PCT/IB/338 Notification of Transmittal of Translation of the International Preliminary Report on Patentability including PCT/IB/373 and PCT/ISA/237 (in English) dated Aug. 3, 2017 for International Application No. PCT/JP2016/050310.

* cited by examiner

SUBSTRATE PROCESSING APPARATUS

CROSS-REFERENCE TO RELATED APPLICATIONS

The present application is a 35 U.S.C. §§ 371 national phase conversion of PCT/JP2016/050310, filed Jan. 7, 2016, which claims priority to Japanese Patent Application No. 2015-008592, filed Jan. 20, 2015, the contents of both of which are incorporated herein by reference. The PCT International Application was published in the Japanese language.

TECHNICAL FIELD

The present invention relates to a substrate processing apparatus for processing substrates.

BACKGROUND ART

A process of manufacturing semiconductor substrates (hereinafter, simply referred to as "substrates") has conventionally used a substrate processing apparatus that supplies processing liquids to a substrate that is being rotated, to perform various types of processing on the substrate. Such a substrate processing apparatus may include a cup part that is disposed around a substrate and receives, for example, processing liquids that are dispersed from the substrate by centrifugal force.

For example, a resist coating processor in Japanese Patent Application Laid-Open No. 2010-10251 (Document 1) has an exhaust port in the bottom of a processing cup. The processing cup has a canopy portion that extends radially outward from around a substrate. The gas above the substrate flows into the processing cup from clearance between the inner peripheral edge of the canopy portion of the processing cup and the substrate and is discharged through the exhaust port to the outside of the processing cup. The canopy portion has a plurality of vent holes in its outer periphery, and an opening-and-closing mechanism that covers and closes the plurality of vent holes from above is provided above the canopy portion. In the case of forming a resist film on the substrate, the opening-and-closing mechanism is moved upward and spaced from the canopy portion to open the plurality of vent holes. Thus, the gas above the substrate flows into the processing cup from the clearance between the inner peripheral edge of the canopy portion of the processing cup and the substrate and from the plurality of vent holes. As a result, the air current in the vicinity of the outer peripheral edge of the substrate is controlled, and the occurrence of a phenomenon in which a resist liquid stands up on the outer peripheral edge portion of the substrate is suppressed.

In a treating device for substrates disclosed in Japanese Patent Application Laid-Open No. 2010-10555 (Document 2), the internal space of a cup body is divided into an inner peripheral space and an outer peripheral space by a cylindrical movable partition body that extends upward from the bottom of the cup body. The movable partition body has an opening provided with a material that allows passage of gases but rejects passage of liquids (e.g., an air-permeable member made of fabrics or a porous material). When deionized water is supplied to a substrate, the movable partition body is moved down and located below the substrate, so that the deionized water drops into the outer peripheral space. The bottom of the outer peripheral space is connected to an exhaust blower via a gas-liquid separator, through which the deionized water dropped in the outer peripheral space and the atmosphere in the outer peripheral space are discharged to the outside of the cup body. When a chemical solution is supplied to the substrate, the movable partition body is moved up and located around the substrate, so that the chemical solution drops into the inner peripheral space. The atmosphere in the inner peripheral space is sucked into the outer peripheral space through the aforementioned opening of the movable partition body and discharged via the gas-liquid separator to the outside of the cup body.

A wafer cleaning device in Japanese Patent Application Laid-Open No. 2012-146835 (Document 3) has an air outlet and a drain outlet in the vicinity of the bottom of a spin cup. The wafer cleaning device switches between the air outlet provided in the vicinity of the bottom of the spin cup and an air outlet provided above the spin cup and the substrate in the side surface of a chamber. More specifically, a shutter that opens and closes the air outlet in the side surface of the chamber is provided and moved up and down in synchronization with up-down movement of the spin cup. At the time of conveyance of a substrate into and out of the chamber, the spin cup is moved down to close the air outlet provided in the vicinity of the bottom of the spin cup and to open the air outlet provided in the side surface of the chamber. In the case of processing a substrate with liquids, the spin cup is moved up to open the air outlet provided in the vicinity of the bottom of the spin cup and to close the air outlet provided in the side surface of the chamber. This mechanism keeps the internal pressure of the chamber almost constant.

In the devices disclosed in Documents 1 to 3, the same exhaust port or air outlet is used to discharge the atmosphere in the processing cup, even if the type of processing liquid used to process the substrate is changed. There is thus a possibility that, inside piping or the like connected to the exhaust port or air outlet, the atmosphere of a sucked processing liquid may be mixed with the atmosphere of other processing liquids remaining in the piping, causing undesirable mixing and interference of the processing liquids. The treating device in Document 2 may increase in size because the gas-liquid separator is provided outside the cup body as described above. Moreover, if adjustment of the flow rate of the gas exhausted from the exhaust port is required, the substrate processing apparatuses as described above may have a complicated structure and increase in size because a mechanism for adjusting the flow rate of the exhaust gas is provided in the exhaust pipe.

SUMMARY OF INVENTION

The present invention is intended for a substrate processing apparatus for processing a substrate, and it is an object of the present invention to facilitate switching between exhaust mechanisms.

A substrate processing apparatus according to the present invention includes a substrate holder for holding a substrate in a horizontal position, a processing-liquid supply part for supplying a processing liquid to the substrate, a cup part having a ring shape about a central axis pointing in an up-down direction, and for receiving a processing liquid from the substrate, a chamber that houses therein the substrate holder and the cup part, a cup elevating mechanism for moving the cup part relative to the substrate holder in the up-down direction, and a controller for causing the cup elevating mechanism to relatively move the cup part and determining relative positions of the cup part and the substrate holder. The cup part includes a circular ring-shaped cup bottom portion, a tubular cup inner side-wall portion that extends upward from an inner peripheral portion of the cup bottom portion, and a tubular cup outer side-wall portion that extends upward from an outer peripheral portion of the cup bottom portion. A cup exhaust port is provided in the cup inner side-wall portion or the cup outer side-wall portion. A first chamber exhaust port and a second chamber exhaust port are provided that oppose the cup inner side-wall portion on an inner side of the cup inner side-wall portion or oppose the cup outer side-wall portion on an outer side of the cup outer side-wall portion. The controller causes the cup exhaust port to selectively overlap the first chamber exhaust port or the second chamber exhaust port by controlling the cup elevating mechanism. In a state in which the cup exhaust port overlaps the first chamber exhaust port, gas in the cup part is exhausted through the cup exhaust port and the first chamber exhaust port to an outside of the chamber by a first exhaust mechanism that is connected to the first chamber exhaust port. In a state in which the cup exhaust port overlaps the second chamber exhaust port, gas in the cup part is exhausted through the cup exhaust port and the second chamber exhaust port to the outside of the chamber by a second exhaust mechanism that is connected to the second chamber exhaust port. This substrate processing apparatus can facilitate switching between the exhaust mechanisms.

In a preferred embodiment of the present invention, the second chamber exhaust port is located at a circumferential position different from a circumferential position of the first chamber exhaust port, and the cup exhaust port includes a first cup exhaust port that is located at the same circumferential position as the circumferential position of the first chamber exhaust port, and a second cup exhaust port that is located at the same circumferential position as the circumferential position of the second chamber exhaust port.

Another substrate processing apparatus according to the present invention includes a substrate holder for holding a substrate in a horizontal position, a processing-liquid supply part for supplying a processing liquid to the substrate, a cup part having a ring shape about a central axis pointing in an up-down direction, and for receiving a processing liquid from the substrate, a chamber that houses therein the substrate holder and the cup part, a cup elevating mechanism for moving the cup part relative to the substrate holder in the up-down direction, and a controller for causing the cup elevating mechanism to relatively move the cup part and determining relative positions of the cup part and the substrate holder. The cup part includes a circular ring-shaped cup bottom portion, a tubular cup inner side-wall portion that extends upward from an inner peripheral portion of the cup bottom portion, and a tubular cup outer side-wall portion that extends upward from an outer peripheral portion of the cup bottom portion. A cup exhaust port is provided in the cup inner side-wall portion or the cup outer side-wall portion. A chamber exhaust port is provided that opposes the cup inner side-wall portion on an inner side of the cup inner side-wall portion or opposes the cup outer side-wall portion on an outer side of the cup outer side-wall portion. In a state in which the cup exhaust port overlaps the chamber exhaust port, gas in the cup part is exhausted through the cup exhaust port and the chamber exhaust port to an outside of the chamber by an exhaust mechanism that is connected to the chamber exhaust port. A flow rate of the gas exhausted from the chamber by the exhaust mechanism is changed by the controller controlling the cup elevating mechanism to change an area of overlap between the cup exhaust port and the chamber exhaust port.

In a preferred embodiment of the present invention, the chamber exhaust port includes a large chamber exhaust port, and a small chamber exhaust port that is aligned in the up-down direction with the large chamber exhaust port and has a cross-sectional area smaller than a cross-sectional area of the large chamber exhaust port. Changing the area of overlap between the cup exhaust port and the chamber exhaust port is equivalent to causing the cup exhaust port to selectively overlap the large chamber exhaust port or the small chamber exhaust port.

In another preferred embodiment of the present invention, the cup exhaust port includes a large cup exhaust port, and a small cup exhaust port that is aligned in the up-down direction with the large cup exhaust port and has a cross-sectional area smaller than a cross-sectional area of the large cup exhaust port. Changing the area of overlap between the cup exhaust port and the chamber exhaust port is equivalent to selectively causing the large cup exhaust port or the small cup exhaust port to overlap the chamber exhaust port.

In another preferred embodiment of the present invention, changing the area of overlap between the cup exhaust port and the chamber exhaust port is implemented by moving the cup part relative to the substrate holder in the up-down direction while maintaining the overlap between the cup exhaust port and the chamber exhaust port.

In another preferred embodiment of the present invention, the cup exhaust port is provided in the cup inner side-wall portion.

In another preferred embodiment of the present invention, the substrate holder includes a holder body having a disc-like shape about the central axis. The cup part further includes a circular ring-shaped cup canopy portion that extends inward from an upper end portion of the cup outer side-wall portion. During conveyance of a substrate into and out of the chamber, the controller controls the cup elevating mechanism to cause the holder body to be located at the same position in the up-down direction as a position of an inner peripheral portion of the cup canopy portion and in close proximity to the inner peripheral portion of the cup canopy portion.

In another preferred embodiment of the present invention, the cup part further includes a tubular cup intermediate wall portion between the cup inner side-wall portion and the cup outer side-wall portion, the cup intermediate wall portion extending upward from the cup bottom portion. The cup bottom portion has a first cup drain port that is located inward of the partition wall, and a second cup drain port that is located outward of the partition wall. The first cup drain port is connected via a first chamber drain port to a first drain part that is disposed outside the chamber, the first chamber drain port being provided in a chamber bottom portion of the chamber. The second cup drain port is connected via a second chamber drain port to a second drain part that is disposed outside the chamber, the second chamber drain port being provided in the chamber bottom portion. The cup elevating mechanism moves the cup part between a first position that is determined based on the substrate holder and a second position that is below the first position. In a state in which the cup part is located at the first position, a processing liquid supplied from the processing-liquid supply part to the substrate flows into a space between the cup inner side-wall portion and the cup intermediate wall portion of the cup part and is discharged to the first drain part. In a state in which the cup part is located at the second position, a processing liquid supplied from the processing-liquid supply part to the substrate flows into a space between the cup intermediate wall portion and the cup outer side-wall portion of the cup part and is discharged to the second drain part.

In another preferred embodiment of the present invention, the substrate holder includes a holder body having a disc-like shape about the central axis. The holder body opposes the cup part in the up-down direction, above the cup part. The holder body has a ring-shaped protruding portion that protrudes downward from a lower surface of the holder body and surrounds the central axis.

In another preferred embodiment of the present invention, the chamber is an enclosed-space forming part that forms an enclosed space in which the substrate holder and the cup part are disposed.

These and other objects, features, aspects and advantages of the present invention will become more apparent from the following detailed description of the present invention when taken in conjunction with the accompanying drawings.

DESCRIPTION OF EMBODIMENTS

Figure 1:
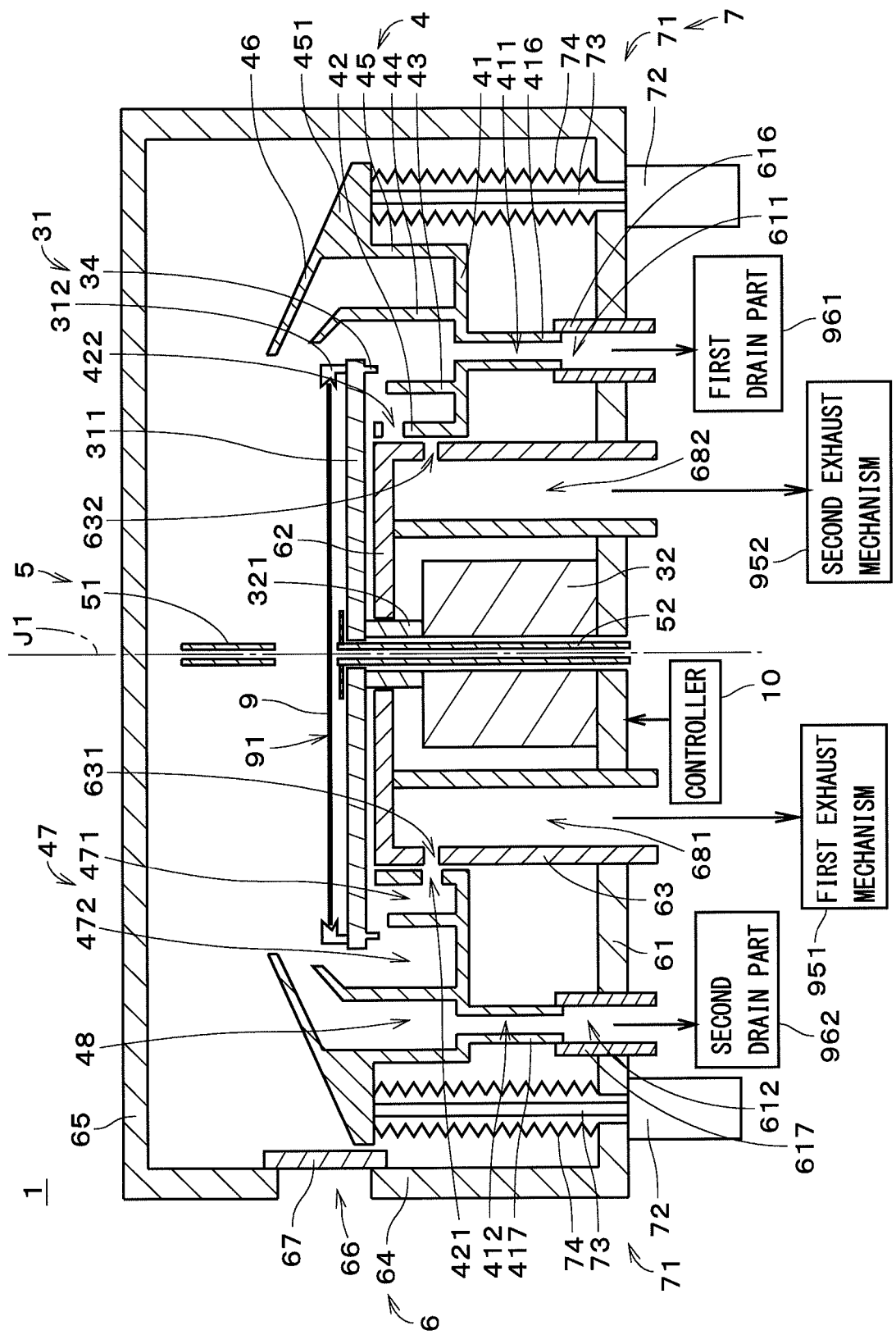
FIG. 1 is a longitudinal cross-sectional view of a substrate processing apparatus according to a first embodiment.

FIG. 1 is a longitudinal cross-sectional view of a substrate processing apparatus 1 according to a first embodiment of the present invention. The substrate processing apparatus 1 is a single wafer processing apparatus for processing generally disc-shaped semiconductor substrates 9 (hereinafter, simply referred to as "substrates 9") one at a time by supplying processing liquids to the substrates 9. The substrate processing apparatus 1 uses, for example, deionized water, acid chemical solutions, and alkaline chemical solutions as processing liquids and performs various types of processing such as cleaning on the substrates 9. In FIG. 1, cross-sections of some constituent elements of the substrate processing apparatus 1 are not hatched (the same applies to the other longitudinal cross-sectional views).

The substrate processing apparatus 1 includes a substrate holder 31, a substrate rotation mechanism 32, a cup part 4, a cup elevating mechanism 7, a processing-liquid supply part 5, a chamber 6, and a controller 10. The controller 10 is not illustrated in FIG. 2 and onward. The chamber 6 houses therein the substrate holder 31, the substrate rotation mechanism 32, the cup part 4, and the processing-liquid supply part 5.

The chamber 6 has a chamber bottom portion 61, a chamber upper-bottom portion 62, a chamber inner side-wall portion 63, a chamber outer side-wall portion 64, and a chamber canopy portion 65. The chamber bottom portion 61 covers the bottoms of the cup part 4 and the substrate rotation mechanism 32. The chamber upper-bottom portion 62 is a generally circular ring plate-like portion about a central axis J1 pointing in the up-down direction. The chamber upper-bottom portion 62 covers the top of the substrate rotation mechanism 32 and the bottom of the substrate holder 31, above the chamber bottom portion 61. The chamber inner side-wall portion 63, which is a side wall portion of the chamber 6, is a generally cylindrical portion about the central axis J1. The chamber inner side-wall portion 63 extends downward from the outer peripheral portion of the chamber upper-bottom portion 62 to the chamber bottom portion 61. The chamber inner side-wall portion 63 is located radially inward of the cup part 4.

The chamber outer side-wall portion 64, which is a side wall portion of the chamber 6, is a generally tubular portion located radially outward of the cup part 4. The chamber outer side-wall portion 64 extends upward from the outer peripheral portion of the chamber bottom portion 61 to the outer peripheral portion of the chamber canopy portion 65. The chamber canopy portion 65 covers the tops of the cup part 4 and the substrate holder 31. The chamber outer side-wall portion 64 has a conveyance port 66 through which a substrate 9 is conveyed into and out of the chamber 6. The conveyance port 66 is closed by a lid part 67 that is movable in the up-down direction. When the conveyance port 66 is closed by the lid part 67, the internal space of the chamber 6 becomes an enclosed space. That is, the chamber 6 is an enclosed space forming portion that forms an enclosed space in which the substrate holder 31 and the cup part 4 are disposed.

Figure 2:
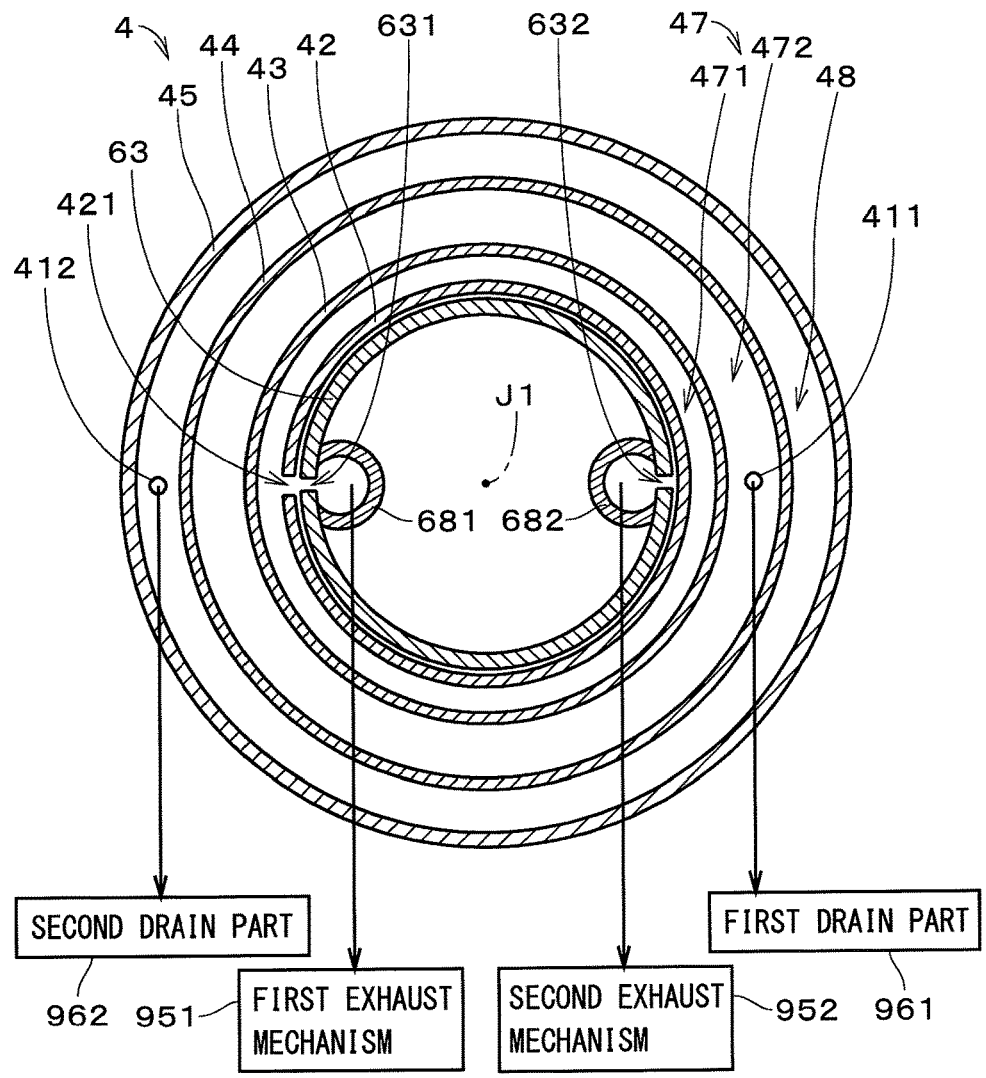
FIG. 2 is a transverse cross-sectional view of the substrate processing apparatus.
Figure 3:
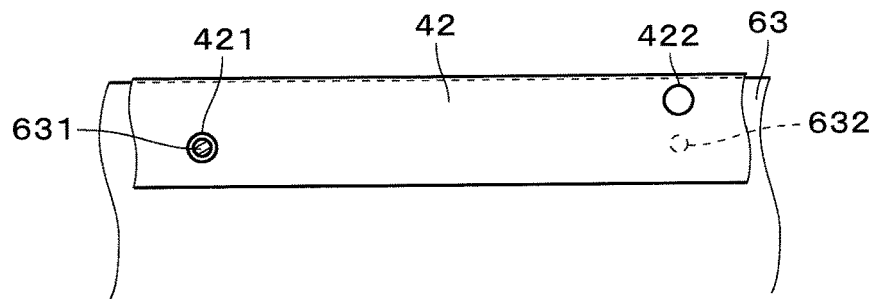
FIG. 3 illustrates part of a cup inner side-wall portion and a chamber inner side-wall portion in developed form.

FIG. 2 is a transverse cross-sectional view of the chamber inner side-wall portion 63 and the cup part 4 illustrated in FIG. 1. FIG. 2 is a transverse cross-sectional view taken at a position in the up-down direction of a first chamber exhaust port 631, which will be described later. FIG. 2 also illustrates part of the configuration below the cross-section. The same applies to FIG. 5. FIG. 3 illustrates part of outer side surfaces of a cup inner side-wall portion 42, which will be described later, and the chamber inner side-wall portion 63 in developed form. The right-left direction in FIG. 3 corresponds to a circumferential direction about the central axis J1 (hereinafter, also simply referred to as a "circumferential direction"). The same applies to FIGS. 6, 10, 12, 13, and 15 to 18.

As illustrated in FIGS. 1 to 3, the chamber inner side-wall portion 63 has the first chamber exhaust port 631 and a second chamber exhaust port 632. The first chamber exhaust port 631 and the second chamber exhaust port 632 are used to discharge the gas in the cup part 4 to the outside of the chamber 6.

The first chamber exhaust port 631 and the second chamber exhaust port 632 may be through holes that pass through the chamber inner side-wall portion 63 in approximately a radial direction. The first chamber exhaust port 631 and the second chamber exhaust port 632 may have generally circular cross-sectional shapes that are perpendicular to their flow passages (hereinafter, also simply referred to as "cross-sectional shapes"). The cross-sectional shapes of the first chamber exhaust port 631 and the second chamber exhaust port 632 may be appropriately changed. In the example illustrated in FIGS. 1 to 3, the first chamber exhaust port 631 and the second chamber exhaust port 632 are located at approximately the same position in the up-down direction. The second chamber exhaust port 632 is located at a circumferential position different from that of the first chamber exhaust port 631. To be more specific, the second chamber exhaust port 632 is located at a circumferential position shifted by 180 degrees from that of the first chamber exhaust port 631 (i.e., at a radially opposite position with the central axis J1 in between).

The first chamber exhaust port 631 is connected to a first duct 681 that extends in the up-down direction on the inner side (i.e., radially inward) of the chamber inner side-wall portion 63. In other words, the first chamber exhaust port 631 connects the internal space of the chamber 6 and the first duct 681. The first duct 681 is connected to a first exhaust mechanism 951. The second chamber exhaust port 632 is connected to a second duct 682 that extends in the up-down direction on the inner side (i.e., radially inward) of the chamber inner side-wall portion 63. In other words, the second chamber exhaust port 632 connects the internal space of the chamber 6 and the second duct 682. The second duct 682 is connected to a second exhaust mechanism 952 different from the first exhaust mechanism 951. The first duct 681 and the second duct 682 are part of the chamber 6. The first exhaust mechanism 951 and the second exhaust mechanism 952 are disposed outside the chamber 6 and the substrate processing apparatus 1. While the substrate processing apparatus 1 is in use, the first exhaust mechanism 951 and the second exhaust mechanism 952 continuously carry out suction at a constant output.

In the following description, the first chamber exhaust port 631 and the second chamber exhaust port 632 are also collectively referred to as a "chamber exhaust port." In other words, the chamber exhaust port includes the first chamber exhaust port 631 and the second chamber exhaust port 632. When there is no particular need to distinguish between the first chamber exhaust port 631 and the second chamber exhaust port 632, one of the first chamber exhaust port 631 and the second chamber exhaust port 632 may be referred to as a "chamber exhaust port."

The first exhaust mechanism 951 and the second exhaust mechanism 952 are also collectively referred to as an "exhaust mechanism." In other words, the exhaust mechanism includes the first exhaust mechanism 951 and the second exhaust mechanism 952. When there is no particular need to distinguish between the first exhaust mechanism 951 and the second exhaust mechanism 952, one of the first exhaust mechanism 951 and the second exhaust mechanism 952 may be referred to as an "exhaust mechanism."

The chamber bottom portion 61 has a first chamber drain port 611 and a second chamber drain port 612 at positions radially outward of the chamber inner side-wall portion 63. The first chamber drain port 611 and the second chamber drain port 612 are used to discharge the liquid in the cup part 4 to the outside of the chamber 6. The first chamber drain port 611 and the second chamber drain port 612 may be through holes that pass through the chamber bottom portion 61 in the up-down direction. In the example illustrated in FIG. 1, the first chamber drain port 611 and the second chamber drain port 612 are respectively formed inside chamber protruding portions 616 and 617 that have generally columnar shapes and protrude upward from the chamber bottom portion 61. The first chamber drain port 611 and the second chamber drain port 612 may have generally circular cross-sectional shapes that are perpendicular to their flow passages (hereinafter, also simply referred to as "cross-sectional shapes"). The cross-sectional shapes of the first chamber drain port 611 and the second chamber drain port 612 may be appropriately changed.

The first chamber drain port 611 is located radially inward of the second chamber drain port 612. In the example illustrated in FIGS. 1 and 2, the second chamber drain port 612 is located at a circumferential position different from that of the first chamber drain port 611. To be more specific, the second chamber drain port 612 is located at a circumferential position shifted by 180 degrees from that of the first chamber drain port 611 (i.e., at a radially opposite position with the central axis J1 in between). The first chamber drain port 611 is located at a circumferential position shifted by 180 degrees from that of the first chamber exhaust port 631, i.e., at the same circumferential position as that of the second chamber exhaust port 632. The second chamber drain port 612 is located at a circumferential position shifted by 180 degrees from that of the second chamber exhaust port 632, i.e., at the same circumferential position as that of the first chamber exhaust port 631. The first chamber drain port 611 is connected to a first drain part 961. The second chamber drain port 612 is connected to a second drain part 962. The first drain part 961 and the second drain part 962 are disposed outside the chamber 6 and the substrate processing apparatus 1.

In the following description, the first chamber drain port 611 and the second chamber drain port 612 are also collectively referred to as a "chamber drain port." In other words, the chamber drain port includes the first chamber drain port 611 and the second chamber drain port 612. When there is no particular need to distinguish between the first chamber drain port 611 and the second chamber drain port 612, one of the first chamber drain port 611 and the second chamber drain port 612 may be referred to as a "chamber drain port."

The first drain part 961 and the second drain part 962 are also collectively referred to as a "drain part." In other words, the drain part includes the first drain part 961 and the second drain part 962. When there is no particular need to distinguish between the first drain part 961 and the second drain part 962, one of the first drain part 961 and the second drain part 962 may be referred to as a "drain part."

The substrate holder 31 holds the substrate 9 in a horizontal position. More specifically, the substrate 9 is held by the substrate holder 31 with its upper surface 91 facing upward perpendicular to the central axis J1, the upper surface 91 having a fine pattern previously formed thereon. The substrate holder 31 includes a base portion 311, a plurality of chucks 312, and a protruding portion 34. The base portion 311 is a holder body having a generally disc-like shape about the central axis J1. The base portion 311 is perpendicular to the central axis J1 and has an opening in the center. The outer peripheral portion of the base portion 311 opposes the cup part 4 in the up-down direction, above the inner peripheral portion of the cup part 4. The outer peripheral edge of the base portion 311 opposes the cup part 4 in the radial direction on the radially inner side of the outer peripheral portion of the cup part 4.

The plurality of (e.g., three) chucks 312 are fixed to the upper surface of the base portion 311. The plurality of chucks 312 are arranged at approximately equiangular intervals in the circumferential direction about the central axis J1. The plurality of chucks 312 hold the outer edge portion of the substrate 9 above the base portion 311. The protruding portion 34 protrudes downward (i.e., toward the cup part 4) from the lower surface of the outer peripheral portion of the base portion 311. The protruding portion 34 has a ring shape that surrounds the central axis J1. To be more specific, the protruding portion 34 is a generally cylindrical portion about the central axis J1. The protruding portion 34 may be formed integrally with the base portion 311.

The substrate rotation mechanism 32 is disposed between the chamber bottom portion 61 and the chamber upper-bottom portion 62 on the radially inner side of the chamber inner side-wall portion 63. The substrate rotation mechanism 32 may be an axial-rotation electric motor. A rotation shaft 321 of the substrate rotation mechanism 32 passes through the central portion of the chamber upper-bottom portion 62 to the inside of the chamber 6. The rotation shaft 321 has a generally cylindrical shape about the central axis J1. The tip portion of the rotation shaft 321 is connected to the base portion 311 of the substrate holder 31. A seal that prevents passage of gases and liquids is provided between the rotation shaft 321 and the chamber upper-bottom portion 62. Rotation of the rotation shaft 321 causes the substrate holder 31 to rotate along with the substrate 9 about the central axis J1.

The processing-liquid supply part 5 supplies a processing liquid to the substrate 9. The processing-liquid supply part 5 includes an upper nozzle 51 and a lower nozzle 52. The upper nozzle 51 is located above the substrate holder 31 and the substrate 9. The upper nozzle 51 is supported by a nozzle supporter, which is not shown. The lower end of the upper nozzle 51 opposes the central portion of the upper surface 91 of the substrate 9. The upper nozzle 51 is connected to a processing-liquid supply source (not shown) provided outside the chamber 6. A processing liquid supplied from the processing-liquid supply source to the upper nozzle 51 is supplied from the lower end of the upper nozzle 51 toward the central portion of the upper surface 91 of the substrate 9.

The lower nozzle 52 is disposed on the inner side of the rotation shaft 321 of the substrate rotation mechanism 32 and protrudes above from the base portion 311 through the opening in the center of the base portion 311 of the substrate holder 31. The lower nozzle 52 is not in contact with the rotation shaft 321 and does not rotate during rotation of the rotation shaft 321. A seal that prevents passage of gases and liquids is provided between the lower nozzle 52 and the base portion 311. The lower nozzle 52 is connected to a processing-liquid supply source (not shown) provided outside the chamber 6. The upper end of the lower nozzle 52 is located below the substrate 9 and opposes the central portion of the lower surface of the substrate 9. A processing liquid supplied from the processing-liquid supply source to the lower nozzle 52 is supplied from the upper end of the lower nozzle 52 toward the central portion of the lower surface of the substrate 9.

The cup part 4 is a ring-shaped member about the central axis J1. The cup part 4 is located around and below the substrate holder 31 and the substrate 9 and receives processing liquids from the substrate 9. The cup part 4 is located radially outward of the chamber inner side-wall portion 63 of the chamber 6 and surrounds the chamber inner side-wall portion 63 and the substrate rotation mechanism 32.

The cup part 4 includes a cup bottom portion 41, a cup inner side-wall portion 42, a cup partition wall 43, a cup intermediate wall portion 44, a cup outer side-wall portion 45, and a cup canopy portion 46. The cup bottom portion 41 is a generally circular ring-shaped portion about the central axis J1. The cup inner side-wall portion 42 is a generally cylindrical portion that extends upward from the inner peripheral portion of the cup bottom portion 41. The chamber inner side-wall portion 63 is disposed on the inner side (i.e., radially inward) of the cup inner side-wall portion 42. In other words, the chamber inner side-wall portion 63 radially opposes the cup inner side-wall portion 42 on the inner side of the cup inner side-wall portion 42.

The cup outer side-wall portion 45 is a generally cylindrical portion that extends upward from the outer peripheral portion of the cup bottom portion 41. In the example illustrated in FIGS. 1 and 2, the cup inner side-wall portion 42 and the cup outer side-wall portion 45 are generally cylindrical portions about the central axis J1. The cup canopy portion 46 is a generally circular ring-shaped portion that extends inward (i.e., radially inward) from the upper end portion of the cup outer side-wall portion 45. In the example illustrated in FIG. 1, the cup canopy portion 46 is an inclined portion that is inclined upward as it extends radially inward from the upper end portion of the cup outer side-wall portion 45. The diameter of the upper edge of the cup canopy portion 46 is slightly larger than the diameter of the substrate holder 31.

The cup intermediate wall portion 44 is a generally cylindrical portion that extends upward from the cup bottom portion 41 at a position between the cup inner side-wall portion 42 and the cup outer side-wall portion 45. In the example illustrated in FIGS. 1 and 2, the cup intermediate wall portion 44 is a generally cylindrical portion about the central axis J1. The cup intermediate wall portion 44 is located radially outward of the base portion 311 of the substrate holder 31. The upper portion of the cup intermediate wall portion 44 is an inclined portion that is inclined radially inward as it extends upward. The diameter of the upper edge of the cup intermediate wall portion 44 is larger than the diameter of the substrate holder 31. The diameter of the upper edge of the cup intermediate wall portion 44 is larger than the diameter of the upper edge of the cup canopy portion 46.

The cup partition wall 43 is a generally cylindrical portion that extends upward from the cup bottom portion 41 at a position between the cup inner side-wall portion 42 and the cup intermediate wall portion 44. In the example illustrated in FIGS. 1 and 2, the cup partition wall 43 is a generally cylindrical portion about the central axis J1. The cup partition wall 43 is located below the base portion 311. The cup partition wall 43 is located radially inward of the protruding portion 34 of the substrate holder 31. The protruding portion 34 may be spaced above from the cup partition wall 43 and located at the same radial position as that of the cup partition wall 43.

In the following description, the space between the cup intermediate wall portion 44 and the cup outer side-wall portion 45 of the cup part 4 is referred to as an "outer cup space 48." The space between the cup inner side-wall portion 42 and the cup intermediate wall portion 44 of the cup part 4 is referred to as an "inner cup space 47." The inner cup space 47 is divided into a liquid-avoiding space 471, which is a radially inner space, and a liquid-receiving space 472, which is a radially outer space, by the cup partition wall 43. The outer cup space 48, the inner cup space 47, the liquid-avoiding space 471, and the liquid-receiving space 472 are generally cylindrical spaces about the central axis J1.

The cup inner side-wall portion 42 has a first cup exhaust port 421 and a second cup exhaust port 422. The first cup exhaust port 421 and the second cup exhaust port 422 are used to discharge the gas in the cup part 4 to the outside of the chamber 6. The first cup exhaust port 421 and the second cup exhaust port 422 may be through holes that pass through the cup inner side-wall portion 42 in approximately the radial direction. The first cup exhaust port 421 and the second cup exhaust port 422 may have generally circular cross-sectional shapes that are perpendicular to their flow passages (hereinafter, also simply referred to as "cross-sectional shapes"). The diameters of cross-sections of the first cup exhaust port 421 and the second cup exhaust port 422 may be larger than the diameters of cross-sections of the first chamber exhaust port 631 and the second chamber exhaust port 632. The cross-sectional shapes of the first cup exhaust port 421 and the second cup exhaust port 422 may be appropriately changed.

In the example illustrated in FIGS. 1 to 3, the position in the up-down direction of the second cup exhaust port 422 is different from the position in the up-down direction of the first cup exhaust port 421. The second cup exhaust port 422 is located above the first cup exhaust port 421. The second cup exhaust port 422 is located at a circumferential position different from that of the first cup exhaust port 421. To be more specific, the second cup exhaust port 422 is located at a circumferential position shifted by 180 degrees from that of the first cup exhaust port 421 (i.e., at a radially opposite position with the central axis J1 in between).

The first cup exhaust port 421 is located at the same circumferential position as that of the first chamber exhaust port 631. The second cup exhaust port 422 is located at the same circumferential position as that of the second chamber exhaust port 632. In the state illustrated in FIGS. 1 to 3, the first cup exhaust port 421 radially opposes the first chamber exhaust port 631. The second cup exhaust port 422 is located above the second chamber exhaust port 632.

In the following description, the first cup exhaust port 421 and the second cup exhaust port 422 are also collectively referred to as a "cup exhaust port." In other words, the cup exhaust port includes the first cup exhaust port 421 and the second cup exhaust port 422. When there is no particular need to distinguish between the first cup exhaust port 421 and the second cup exhaust port 422, one of the first cup exhaust port 421 and the second cup exhaust port 422 may be referred to as a "cup exhaust port."

The cup bottom portion 41 has a first cup drain port 411 and a second cup drain port 412. The first cup drain port 411 and the second cup drain port 412 are used to discharge the liquid in the cup part 4 to the outside of the chamber 6. The first cup drain port 411 and the second cup drain port 412 may be through holes that pass through the cup bottom portion 41.

In the example illustrated in FIG. 1, the first cup drain port 411 and the second cup drain port 412 are respectively formed inside cup protruding portions 416 and 417 that have generally columnar shapes and protrude downward from the cup bottom portion 41. The first cup drain port 411 and the second cup drain port 412 may have generally circular cross-sectional shapes that are perpendicular to their flow passages (hereinafter, also simply referred to as "cross-sectional shapes"). The cross-sectional shapes of the first cup drain port 411 and the second cup drain port 412 may be appropriately changed.

In the example illustrated in FIGS. 1 and 2, the second cup drain port 412 is located at a circumferential position different from that of the first cup drain port 411. To be more specific, the second cup drain port 412 is located at a circumferential position shifted by 180 degrees from that of the first cup drain port 411 (i.e., at a radially opposite position with the central axis J1 in between). The first cup drain port 411 is located at a circumferential position shifted by 180 degrees from that of the first cup exhaust port 421, i.e., at the same circumferential position as that of the second cup exhaust port 422. The second cup drain port 412 is located at a circumferential position shifted by 180 degrees from that of the second cup exhaust port 422, i.e., at the same circumferential position as that of the first cup exhaust port 421.

The cup protruding portion 416, in which the first cup drain port 411 is provided, is inserted into the first chamber drain port 611 inside the chamber protruding portion 616. Thus, the first cup drain port 411 is connected to the first chamber drain port 611 in the chamber bottom portion 61 of the chamber 6 and connected through the first chamber drain port 611 to the first drain part 961 outside the chamber 6. The cup protruding portion 417, in which the second cup drain port 412 is provided, is inserted into the second chamber drain port 612 inside the chamber protruding portion 617. Thus, the second cup drain port 412 is connected to the second chamber drain port 612 in the chamber bottom portion 61 of the chamber 6 and connected through the second chamber drain port 612 to the second drain part 962 outside the chamber 6.

The first cup drain port 411 is located radially inward of the second cup drain port 412. At the cup bottom portion 41, the first cup drain port 411 is located inward of the cup intermediate wall portion 44. To be more specific, the first cup drain port 411 is located radially inward of the cup intermediate wall portion 44 and radially outward of the cup inner side-wall portion 42 and the cup partition wall 43. In other words, the first cup drain port 411 is located below the inner cup space 47 and extends downward from the bottom of the liquid-receiving space 472. The liquid-receiving space 472 of the inner cup space 47 is connected through the first cup drain port 411 and the first chamber drain port 611 to the first drain part 961.

At the cup bottom portion 41, the second cup drain port 412 is located outward of the cup intermediate wall portion 44. To be more specific, the second cup drain port 412 is located radially outward of the cup intermediate wall portion 44 and radially inward of the cup outer side-wall portion 45. In other words, the second cup drain port 412 is located below the outer cup space 48 and extends downward from the bottom of the outer cup space 48. The outer cup space 48 is connected through the second cup drain port 412 and the second chamber drain port 612 to the second drain part 962.

In the following description, the first cup drain port 411 and the second cup drain port 412 are also collectively referred to as a "cup drain port." In other words, the cup drain port includes the first cup drain port 411 and the second cup drain port 412. When there is no particular need to distinguish between the first cup drain port 411 and the second cup drain port 412, one of the first cup drain port 411 and the second cup drain port 412 may be referred to as a "cup drain port."

The cup elevating mechanism 7 moves the cup part 4 relative to the substrate holder 31 in the up-down direction. In the example illustrated in FIG. 1, the cup elevating mechanism 7 includes a plurality of linear actuators 71 arranged in the circumferential direction. Each linear actuator 71 includes a piston part 72 and a rod 73. The piston part 72 is fixed to the lower surface of the chamber bottom portion 61 outside the chamber 6. The rod 73 extends upward from the piston part 72 through the chamber bottom portion 61. The tip portion of the rod 73 is connected to the cup part 4. To be more specific, the tip portion of the rod 73 is connected to the lower surface of a cup flange portion 451 that protrudes radially outward from the cup outer side-wall portion 45. A generally cylindrical bellows 74 that is extendable in the up-down direction is provided around the rod 73. The upper end of the bellows 74 is connected to the lower surface of the cup flange portion 451, and the lower end of the bellows 74 is connected to the upper surface of the chamber bottom portion 61. Thus, the internal space of the bellows 74, in which the rod 73 is disposed, is isolated from the internal space of the chamber 6. In the cup elevating mechanism 7, the rod 73 of each linear actuator 71 is moved back and forth in the up-down direction by the piston part 62, so that the cup part 4 moves in the up-down direction inside the chamber 6.

Figure 4:
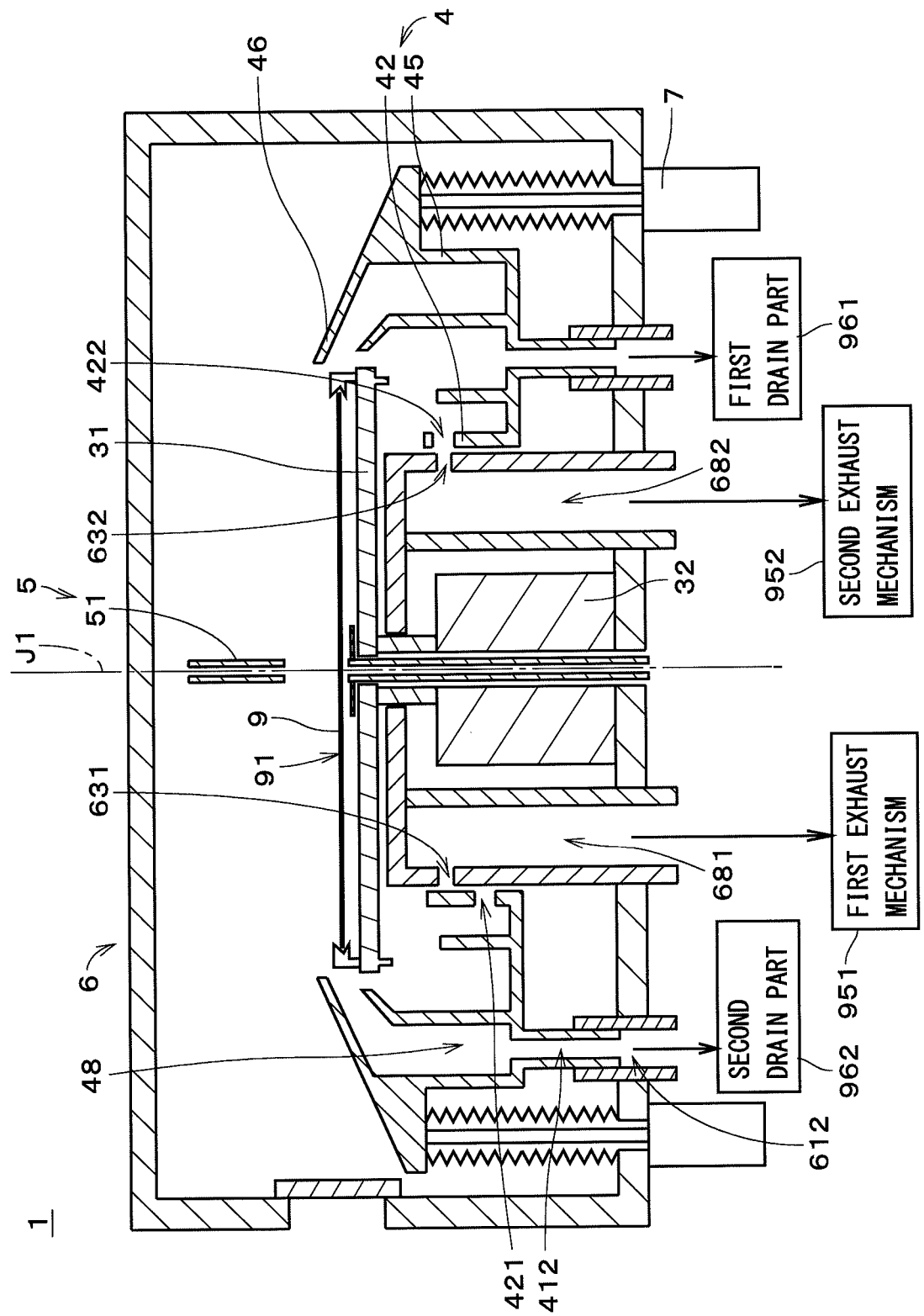
FIG. 4 is a longitudinal cross-sectional view of the substrate processing apparatus.
Figure 5:
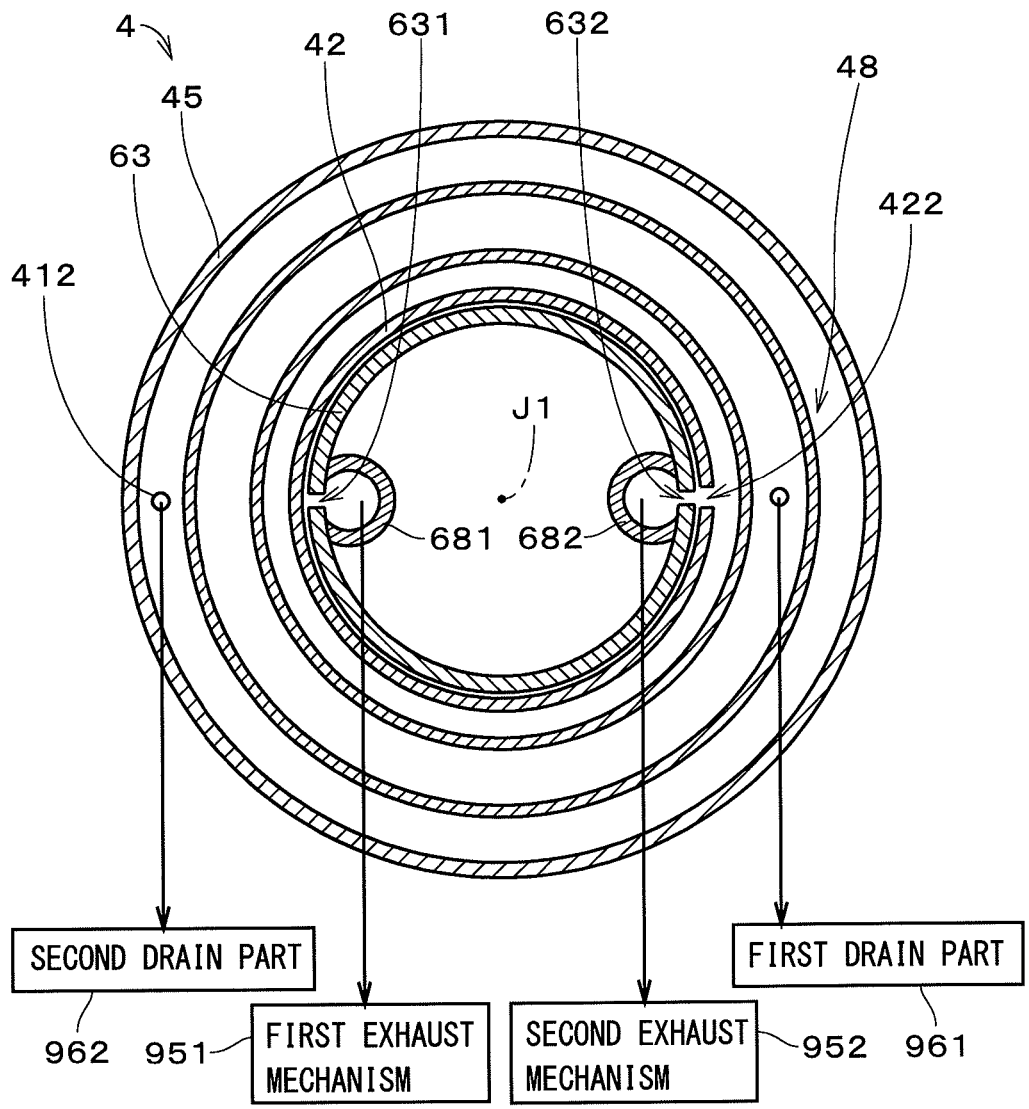
FIG. 5 is a transverse cross-sectional view of the substrate processing apparatus.
Figure 6:
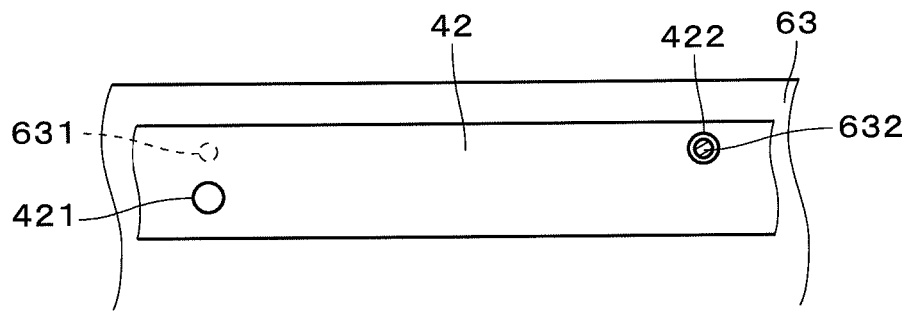
FIG. 6 illustrates part of the cup inner side-wall portion and the chamber inner side-wall portion in developed form.
Figure 7:
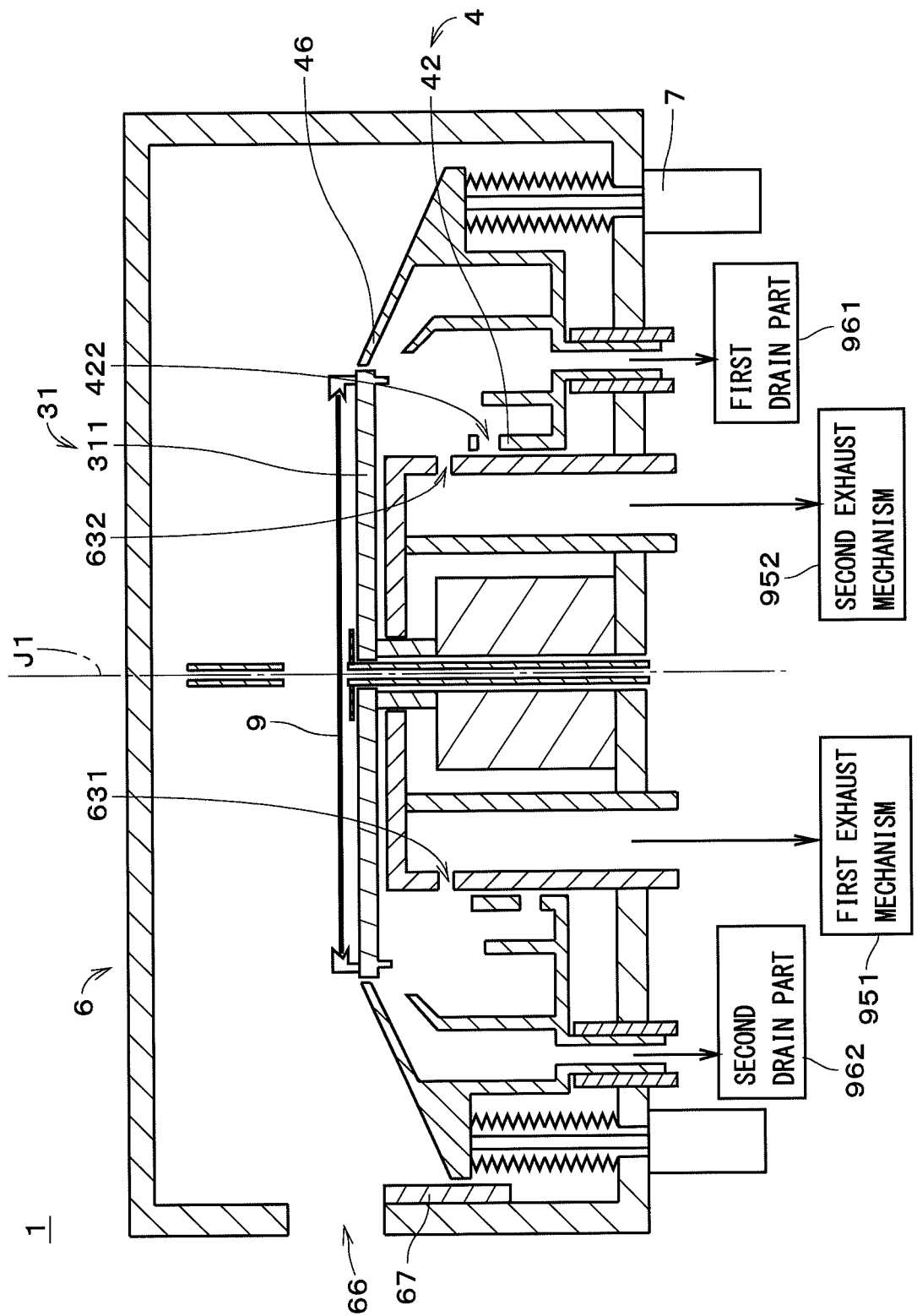
FIG. 7 is a longitudinal cross-sectional view of the substrate processing apparatus.

FIG. 4 is a longitudinal cross-sectional view of the substrate processing apparatus 1 when the cup part 4 is located at a position different from the position illustrated in FIG. 1. FIG. 5 is a transverse cross-sectional view of the chamber inner side-wall portion 63 and the cup part 4 illustrated in FIG. 4. FIG. 5 illustrates a transverse cross-section taken at the position of the first chamber exhaust port 631 in the up-down direction. FIG. 6 illustrates part of the outer side surfaces of the cup inner side-wall portion 42 and the chamber inner side-wall portion 63 illustrated in FIG. 4 in developed form. FIG. 7 is a longitudinal cross-sectional view of the substrate processing apparatus 1 when the cup part 4 is located at a position different from the positions illustrated in FIGS. 1 and 4.

In the substrate processing apparatus 1, the controller 10 (see FIG. 1) controls the cup elevating mechanism 7 so that the cup part 4 is relatively moved in the up-down direction, and the relative positions in the up-down direction of the cup part 4 and the substrate holder 31 are determined. The cup part 4 is moved among the position illustrated in FIG. 1, the position illustrated in FIG. 4, and the position illustrated in FIG. 7 by the cup elevating mechanism 7. In the following description, the position in the up-down direction of the cup part 4 illustrated in FIG. 1, which is determined based on the substrate holder 31, is referred to as a "first position." The positions in the up-down direction of the cup part 4 illustrated in FIGS. 4 and 7, which are determined based on the substrate holder 31, are respectively referred to as a "second position" and a "third position." The second position is below the first position, and the third position is below the second position.

In the state in which the cup part 4 is located at the first position illustrated in FIG. 1, the outer peripheral edge of the substrate 9 radially opposes the cup intermediate wall portion 44. The processing liquid supplied from the upper nozzle 51 of the processing-liquid supply part 5 to the upper surface 91 of the substrate 9 that is being rotated by the substrate rotation mechanism 32 is dispersed radially outward from the substrate 9 by centrifugal force and flows into the liquid-receiving space 472 of the inner cup space 47. The processing liquid flowing into the liquid-receiving space 472 is discharged through the first cup drain port 411 and the first chamber drain port 611 to the first drain part 961.

In the state in which the cup part 4 is located at the first position, the first cup exhaust port 421 radially overlaps the first chamber exhaust port 631 as illustrated in FIGS. 1 to 3. In FIG. 3, a portion of the overlap between the first cup exhaust port 421 and the first chamber exhaust port 631 is hatched (the same applies to FIGS. 6, 10, 12, 13, and 15 to 18). In the state in which the first cup exhaust port 421 of the cup exhaust port overlaps the first chamber exhaust port 631, the gas in the cup part 4 is discharged through the first cup exhaust port 421, the first chamber exhaust port 631, and the first duct 681 to the outside of the chamber 6 by the first exhaust mechanism 951 connected to the first chamber exhaust port 631. The second cup exhaust port 422 is located above the second chamber exhaust port 632 and does not overlap the second chamber exhaust port 632. The second chamber exhaust port 632 is covered by the cup inner side-wall portion 42. Thus, the gas in the cup part 4 substantially does not flow into the second chamber exhaust port 632, the second duct 682, and the second exhaust mechanism 952.

In the state in which the cup part 4 is located at the second position illustrated in FIG. 4, the outer peripheral edge of the substrate 9 radially opposes the cup canopy portion 46, which extends from the upper end portion of the cup outer side-wall portion 45. The outer peripheral edge of the substrate 9 may radially oppose the cup outer side-wall portion 45. The processing liquid supplied from the upper nozzle 51 of the processing-liquid supply part 5 to the upper surface 91 of the substrate 9 that is being rotated is dispersed radially outward from the substrate 9 by centrifugal force and flows into the outer cup space 48. The processing liquid flowing into the outer cup space 48 is discharged through the second cup drain port 412 and the second chamber drain port 612 to the second drain part 962.

In the state in which the cup part 4 is located at the second position, the second cup exhaust port 422 radially overlaps the second chamber exhaust port 632 as illustrated in FIGS. 4 to 6. In the state in which the second cup exhaust port 422 of the cup exhaust port overlaps the second chamber exhaust port 632, the gas in the cup part 4 is discharged through the second cup exhaust port 422, the second chamber exhaust port 632, and the second duct 682 to the outside of the chamber 6 by the second exhaust mechanism 952 connected to the second chamber exhaust port 632. The first cup exhaust port 421 is located below the first chamber exhaust port 631 and does not overlap the first chamber exhaust port 631. The first chamber exhaust port 631 is covered by the cup inner side-wall portion 42. Thus, the gas in the cup part 4 substantially does not flow into the first chamber exhaust port 631, the first duct 681, and the first exhaust mechanism 951.

In the substrate processing apparatus 1, the controller 10 (see FIG. 1) controls the cup elevating mechanism 7 so that the cup exhaust port (i.e., the first cup exhaust port 421 or the second cup exhaust port 422) selectively overlaps the first chamber exhaust port 631 or the second chamber exhaust port 632.

In the state in which the cup part 4 is located at the third position illustrated in FIG. 7, the base portion 311 of the substrate holder 31 is located at approximately the same position in the up-down direction as that of the inner peripheral portion of the cup canopy portion 46. The outer peripheral portion of the base portion 311 is radially in close proximity to the inner peripheral portion of the cup canopy portion 46 with slight clearance therebetween. In the substrate processing apparatus 1, the controller 10 controls the cup elevating mechanism 7 such that the cup part 4 is located at the third position during conveyance of the substrate into and out of the chamber.

Figure 8:
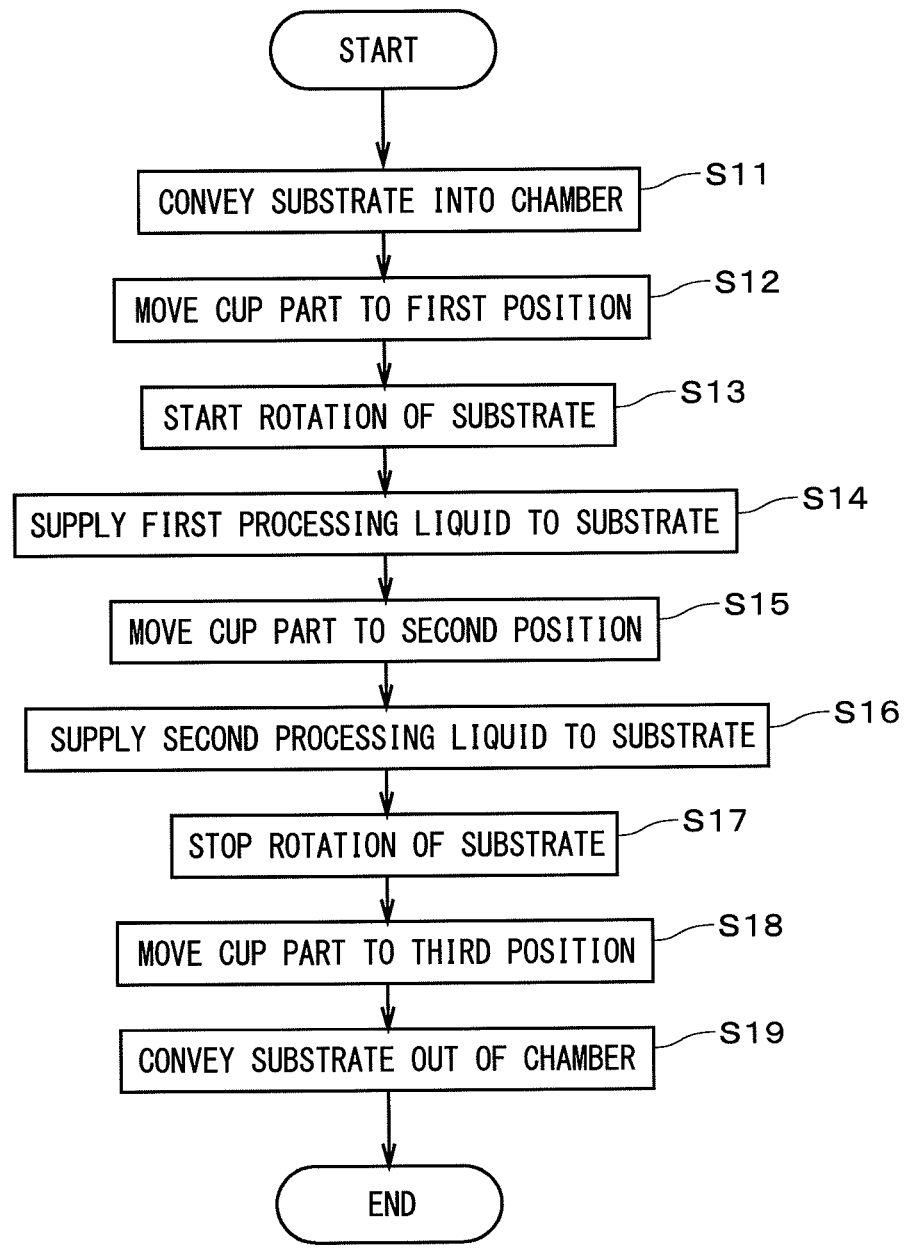
FIG. 8 illustrates a procedure of processing a substrate.

FIG. 8 illustrates an example of the procedure of processing performed on the substrate 9 by the substrate processing apparatus 1. In the processing example, no processing liquids are supplied from the lower nozzle 52. When the substrate processing apparatus 1 performs processing on the substrate 9, first, the substrate 9 is conveyed into the chamber 6 through the conveyance port 66 and held by the substrate holder 31 while the cup part 4 is located at the third position illustrated in FIG. 7 (step S11).

In the state in which the cup part 4 is located at the third position, the first chamber exhaust port 631 and the second chamber exhaust port 632 are not covered by the cup inner side-wall portion 42. Thus, the gas in the vicinity of the first chamber exhaust port 631 and the second chamber exhaust port 632 in the cup part 4 is sucked by the first exhaust mechanism 951 and the second exhaust mechanism 952 that carry out continuous suction. On the other hand, since the inner peripheral portion of the cup canopy portion 46 is radially in close proximity to the outer peripheral portion of the base portion 311 as described above, it is possible to suppress the flow of the gas above the cup part 4 into the cup part 4 from the clearance between the cup canopy portion 46 and the base portion 311. Thus, it is also possible to suppress the suction of the gas in the cup part 4 by the first exhaust mechanism 951 and the second exhaust mechanism 952. Accordingly, a situation can be avoided in which the gas outside the chamber 6 flows into the chamber 6 from the open conveyance port 66 during conveyance of the substrate 9 into the chamber.

When the substrate 9 has been conveyed in the chamber, the conveyance port 66 is closed by the lid part 67, and the internal space of the chamber 6 becomes an enclosed space. The controller 10 controls the cup elevating mechanism 7 so that the cup part 4 is moved up from the third position to the first position illustrated in FIG. 1 (step S12). When the cup part 4 is located at the first position, the substrate rotation mechanism 32 is driven and starts rotating the substrate 9 and the substrate holder 31 (step S13). Step S13 may be performed in parallel with step S12, or may be performed between step S11 and step S12.

Then, the processing-liquid supply part 5 starts supplying a first processing liquid from its upper nozzle 51 to the upper surface 91 of the substrate 9 that is being rotated (step S14). The first processing liquid is continuously supplied to the central portion of the upper surface 91 of the substrate 9 and forced to flow radially outward by centrifugal force. The first processing liquid spreads over the upper surface 91 of the substrate 9 and covers the entire upper surface 91. In this way, the upper surface 91 of the substrate 9 is processed with the first processing liquid. The first processing liquid may be a chemical solution (e.g., a polymer removing liquid or an etchant) used in chemical-solution processing performed on the substrate 9.

The first processing liquid that has reached the outer peripheral edge of the substrate 9 is dispersed radially outward from the outer peripheral edge and flows into the liquid-receiving space 472 of the inner cup space 47 of the cup part 4. The first processing liquid flowing into the liquid-receiving space 472 is discharged through the first cup drain port 411 and the first chamber drain port 611 to the first drain part 961 outside the chamber 6. The first processing liquid discharged to the first drain part 961 is recovered and reused as necessary. Alternatively, the first processing liquid discharged to the first drain part 961 may be discarded.

While the substrate 9 is processed with the first processing liquid, the gas in the cup part 4 is discharged through the first cup exhaust port 421, the first chamber exhaust port 631, and the first duct 681 to the outside of the chamber 6 by the first exhaust mechanism 951 as described above.

After a predetermined period of time has elapsed since the start of the supply of the first processing liquid from the upper nozzle 51, the supply of the first processing liquid is stopped, and the processing of the substrate 9 using the first processing liquid ends. The first processing liquid remaining on the substrate 9 is removed from above the substrate 9 by rotating the substrate 9 and discharged through the liquid-receiving space 472, the first cup drain port 411, and the first chamber drain port 611 to the first drain part 961.

When the processing using the first processing liquid has ended, the controller 10 controls the cup elevating mechanism 7 so that the cup part 4 is moved down from the first position to the second position illustrated in FIG. 4 (step S15). Then, the processing-liquid supply part 5 starts supplying a second processing liquid from its upper nozzle 51 to the upper surface 91 of the substrate 9 that is being rotated (step S16). The second processing liquid is continuously supplied to the central portion of the upper surface 91 of the substrate 9 and forced to spread over the upper surface 91 of the substrate 9 by centrifugal force so as to cover the entire upper surface 91. In this way, the upper surface 91 of the substrate 9 is processed with the second processing liquid. The second processing liquid may be a cleaning liquid such as deionized water (DIW) or carbonated water that is used in processing for cleaning the substrate 9.

The second processing liquid that has reached the outer peripheral edge of the substrate 9 is dispersed radially outward from the outer peripheral edge and flows into the outer cup space 48 of the cup part 4. The second processing liquid flowing into the outer cup space 48 is discharged through the second cup drain port 412 and the second chamber drain port 612 to the second drain part 962 outside the chamber 6. The second processing liquid discharged to the second drain part 962 may be discarded, or may be recovered and reused as necessary.

While the substrate 9 is processed with the second processing liquid, the gas in the cup part 4 is discharged through the second cup exhaust port 422, the second chamber exhaust port 632, and the second duct 682 to the outside of the chamber 6 by the second exhaust mechanism 952 as described above.

After a predetermined period of time has elapsed since the start of the supply of the second processing liquid from the upper nozzle 51, the supply of the second processing liquid is stopped, and the processing of the substrate 9 using the second processing liquid ends. The second processing liquid remaining on the substrate 9 is removed from above the substrate 9 by rotating the substrate 9 and discharged through the outer cup space 48, the second cup drain port 412, and the second chamber drain port 612 to the second drain part 962.

After the second processing liquid is removed from above the substrate 9, the rotation of the substrate 9 and the substrate holder 31 is stopped (step S17). Then, the controller 10 controls the cup elevating mechanism 7 so that the cup part 4 is moved down from the second position to the third position illustrated in FIG. 7 (step S18). Step S18 may be performed in parallel with step S17. When the cup part 4 is located at the third position, the conveyance port 66 is opened to convey the substrate 9 out of the substrate processing apparatus 1 (step S19).

As described above, in the state in which the cup part 4 is located at the third position, the inner peripheral portion of the cup canopy portion 46 is radially in close proximity to the outer peripheral portion of the base portion 311. Thus, it is possible to suppress the flow of the gas outside the chamber 6 into the chamber 6 from the open conveyance port 66 during conveyance of the substrate 9 out of the chamber.

The substrate processing apparatus 1 performs steps S11 to S19 described above in sequence on a plurality of substrates 9, so that the plurality of substrates 9 are sequentially processed.

As described above, in the substrate processing apparatus 1, the controller 10 controls the cup elevating mechanism 7 so that the cup exhaust port (i.e., either the first cup exhaust port 421 or the second cup exhaust port 422) selectively overlaps the first chamber exhaust port 631 or the second chamber exhaust port 632. In the state in which the cup exhaust port overlaps the first chamber exhaust port 631, the first exhaust mechanism 951 connected to the first chamber exhaust port 631 is used to discharge the gas in the cup part 4 through the cup exhaust port and the first chamber exhaust port 631 to the outside of the chamber 6. In the state in which the cup exhaust port overlaps the second chamber exhaust port 632, the second exhaust mechanism 952 connected to the second chamber exhaust port 632 is used to discharge the gas in the cup part 4 through the cup exhaust port and the second chamber exhaust port 632 to the outside of the chamber 6.

In this way, the substrate processing apparatus 1 can easily switch the exhaust mechanism for exhausting gas from the cup part 4 between the first exhaust mechanism 951 and the second exhaust mechanism 952, by causing the cup elevating mechanism 7 to move the cup part 4 relative to the substrate holder 31 in the up-down direction in the chamber 6. Besides, the destination of the gas exhausted from the cup part 4 (hereinafter, referred to as an "exhaust destination") can be switched with a simply structured mechanism, which simplifies the structure of the substrate processing apparatus 1. Accordingly, the substrate processing apparatus 1 can be made more compact than in the case where a switch for switching the exhaust destination of the gas from the cup part is provided outside the chamber. Moreover, by switching the exhaust destination of the gas from the cup part 4 in the chamber 6, the substrate processing apparatus 1 can suppress mixing and interference of gaseous or misty processing liquids during discharge of the gas, more than in the case where the exhaust gas is guided through common piping or the like to a switch provided outside the chamber.

In the substrate processing apparatus 1, the cup exhaust port (i.e., the first cup exhaust port 421 and the second cup exhaust port 422) is provided in the cup inner side-wall portion 42, which is located radially inward of the outer peripheral edge of the substrate 9, and the first chamber exhaust port 631 and the second chamber exhaust port 632 are provided in the chamber inner side-wall portion 63. This configuration can avoid a situation in which processing liquids flowing into the cup part 4 from the substrate 9 enter the first exhaust mechanism 951 and the second exhaust mechanism 952 through the cup exhaust port. The cup part 4 also includes the cup partition wall 43, which extends upward from the cup bottom portion 41, on the radially inner side of the outer cup space 48 and the liquid-receiving space 472 into which the processing liquids flow. This configuration can further avoid a situation in which processing liquids flowing into the cup part 4 enter the first exhaust mechanism 951 and the second exhaust mechanism 952 through the cup exhaust port.

In some cases, the substrate processing apparatus 1 reduces the rotational speed of the substrate 9 (or stops the rotation of the substrate 9) to form puddles of a processing liquid on the upper surface 91 of the substrate 9 during processing of the substrate 9. At this time, the processing liquid flowing from above the substrate 9 to the upper surface of the base portion 311 may flow around to the lower surface of the base portion 311 (i.e., flow along the surface of the base portion 311 to the lower surface thereof).

In the substrate processing apparatus 1, the presence of the ring-shaped protruding portion 34, which protrudes downward from the lower surface of the base portion 311 as described above, allows the processing liquids flowing around to the lower surface of the base portion 311 to flow along the outer peripheral surface of the protruding portion 34 and drop into the liquid-receiving space 472 of the cup part 4. In this way, the substrate processing apparatus 1 can prevent the processing liquids flowing around to the lower surface of the base portion 311 from flowing radially inward of the protruding portion 34 and entering the first exhaust mechanism 951 and the second exhaust mechanism 952 through the cup exhaust port.

As described above, the second chamber exhaust port 632 is located at a circumferential position different from that of the first chamber exhaust port 631. The cup exhaust port includes the first cup exhaust port 421, which is located at the same circumferential position as that of the first chamber exhaust port 631, and the second cup exhaust port 422, which is located at the same circumferential position as that of the second chamber exhaust port 632. Thus, the first duct 681 connected to the first exhaust mechanism 951 and the second duct 682 connected to the second exhaust mechanism 952 can be disposed at different positions in plan view. As a result, the structure of the substrate processing apparatus 1 can be simplified.

In the state of the substrate processing apparatus 1 in which the cup part 4 is located at the first position (i.e., the cup exhaust port overlaps the first chamber exhaust port 631), the processing liquid supplied from the processing-liquid supply part 5 to the substrate 9 flows into the liquid-receiving space 472 of the cup part 4 and is discharged to the first drain part 961. In the state in which the cup part 4 is located at the second position (i.e., the cup exhaust port overlaps the second chamber exhaust port 632), the processing liquid supplied from the processing-liquid supply part 5 to the substrate 9 flows into the outer cup space 48 of the cup part 4 and is discharged to the second drain part 962.

In this way, the substrate processing apparatus 1 can simultaneously perform switching between the exhaust destinations of the gas from the cup part 4 and switching between the destinations of the processing liquid drained from the cup part 4 (hereinafter, referred to as a "drain destinations") with a single mechanism in a single operation by causing the cup elevating mechanism 7 to move the cup part 4 relative to the substrate holder 31 in the up-down direction. As a result, the structure of the substrate processing apparatus 1 can be simplified, and the substrate processing apparatus 1 can be made more compact.

The substrate processing apparatus 1 can change the flow rate of the gas exhausted from the chamber 6 through the cup part 4, without changing the output of the exhaust mechanism, by slightly changing (i.e., slightly adjusting) the position in the up-down direction of the cup part 4 from the first or second position.

Figure 9:
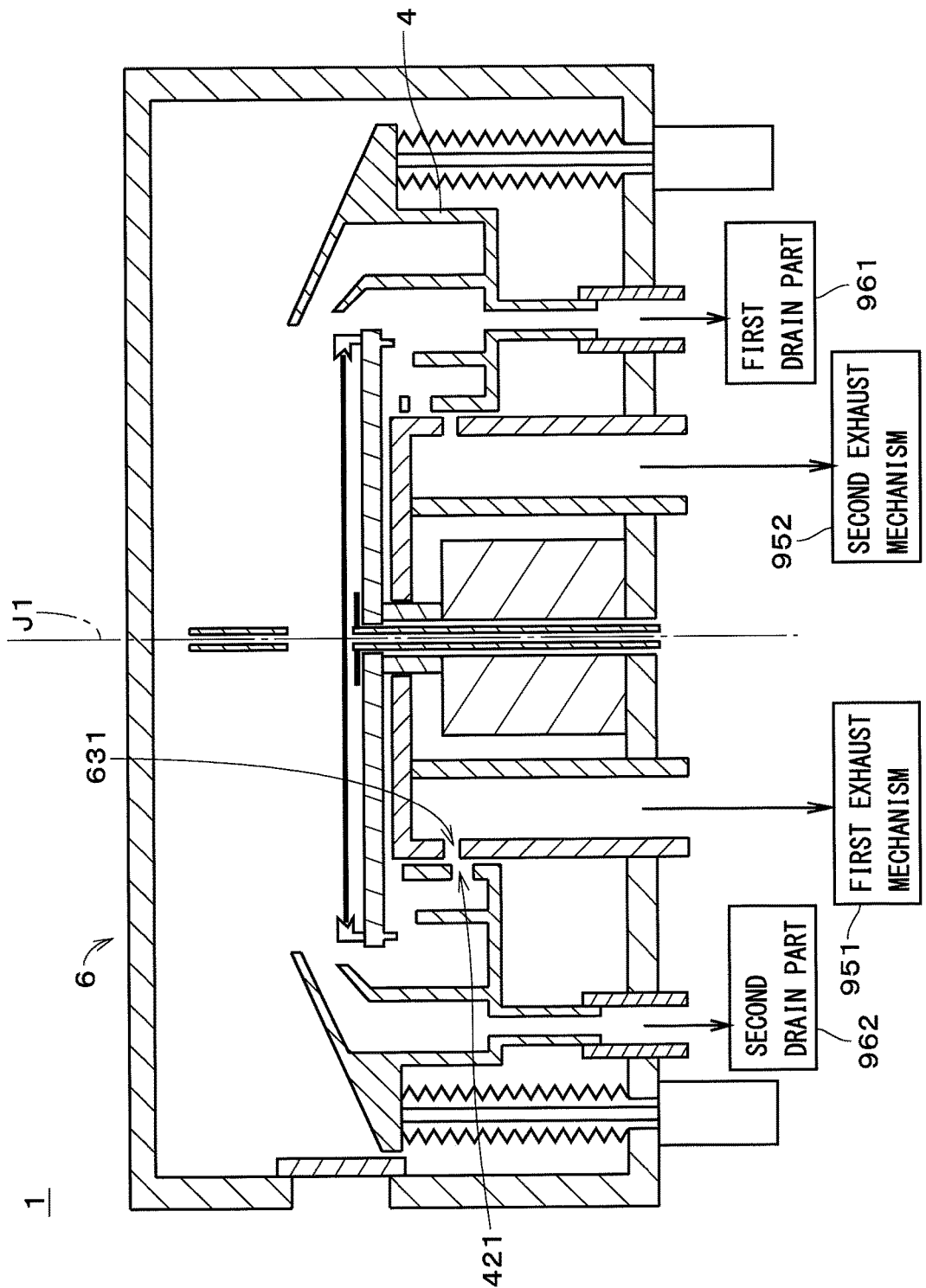
FIG. 9 is a longitudinal cross-sectional view of the substrate processing apparatus.
Figure 10:
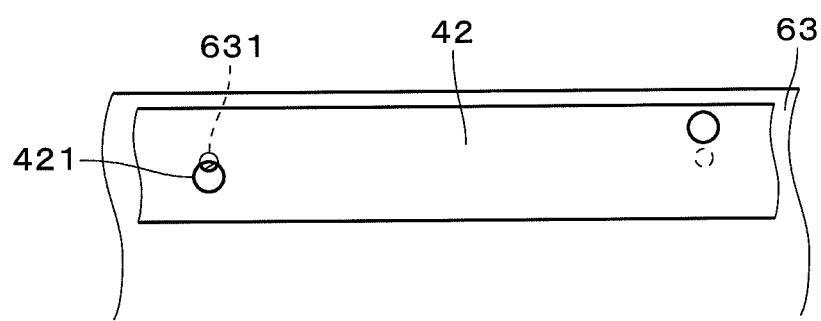
FIG. 10 illustrates part of the cup inner side-wall portion and the chamber inner side-wall portion in developed form.

More specifically, for example, the cup part 4 may be moved down by only a distance smaller than the dimension in the up-down direction of the first chamber exhaust port 631 from the first position illustrated in FIG. 1 and located at a position illustrated in FIG. 9. In this case, the area of overlap between the first cup exhaust port 421 and the first chamber exhaust port 631 is reduced while the first cup exhaust port 421 and the first chamber exhaust port 631 remain overlapping each other as illustrated in FIGS. 9 and 10. As described above, in the state in which the first cup exhaust port 421 overlaps the first chamber exhaust port 631, the gas in the cup part 4 is discharged through the first cup exhaust port 421 and the first chamber exhaust port 631 to the outside of the chamber 6 by the first exhaust mechanism 951 connected to the first chamber exhaust port 631. Thus, a reduction in the area of overlap between the first cup exhaust port 421 and the first chamber exhaust port 631 suppresses the discharge of the gas in the cup part 4 by the first exhaust mechanism 951 and reduces the flow rate of the gas exhausted from inside the chamber 6 to the outside of the chamber 6.

Alternatively, if the cup part 4 is moved up by only a distance smaller than the dimension in the up-down direction of the second chamber exhaust port 632 from the second position illustrated in FIG. 4, the area of overlap between the second cup exhaust port 422 and the second chamber exhaust port 632 is reduced while the second cup exhaust port 422 and the second chamber exhaust port 632 remain overlapping each other. As described above, in the state in which the second cup exhaust port 422 overlaps the second chamber exhaust port 632, the gas in the cup part 4 is discharged through the second cup exhaust port 422 and the second chamber exhaust port 632 to the outside of the chamber 6 by the second exhaust mechanism 952 connected to the second chamber exhaust port 632. Thus, a reduction in the area of overlap between the second cup exhaust port 422 and the second chamber exhaust port 632 suppresses the discharge of the gas exhausted from the cup part 4 by the second exhaust mechanism 952 and reduces the flow rate of the gas exhausted from inside the chamber 6 to the outside of the chamber 6.

In this way, in the state of the substrate processing apparatus 1 in which the cup exhaust port overlaps the chamber exhaust port, the gas in the cup part 4 is discharged through the cup exhaust port and the chamber exhaust port to the outside of the chamber 6 by the exhaust mechanism connected to the chamber exhaust port. Then, the controller 10 controls the cup elevating mechanism 7 to change the area of overlap between the cup exhaust port and the chamber exhaust port and to thereby change the flow rate of the gas exhausted from the chamber 6 by the exhaust mechanism.

The substrate processing apparatus 1 can easily change the flow rate of the gas exhausted from the chamber 6 by changing the position in the up-down direction of the cup part 4. In the substrate processing apparatus 1, the area of overlap between the cup exhaust port and the chamber exhaust port can be changed by moving the cup part 4 relative to the substrate holder 31 in the up-down direction while maintaining the overlap between the cup exhaust port and the chamber exhaust port. Accordingly, the flow rate of the gas exhausted from the chamber 6 can be changed by relatively moving the cup part 4 by only a distance smaller than the dimension in the up-down direction of the cup exhaust port. In other words, the flow rate of the gas exhausted from the chamber 6 can be changed by slightly adjusting the position in the up-down direction of the cup part 4. In this way, the substrate processing apparatus 1 can reduce the distance of relative movement of the cup part 4, involved in changing the flow rate of exhaust gas, which suppresses an increase in the size of the substrate processing apparatus 1 in the up-down direction.

The flow rate of the exhaust gas may be changed in substitution processing in which, after completion of the processing using the second processing liquid (e.g., cleaning liquid) in step S16, a third processing liquid such as isopropyl alcohol (IPA) is supplied to the substrate 9 and substitutes for the second processing liquid remaining on the substrate 9. In the substitution processing, either the rotational speed of the substrate 9 rotated by the substrate rotation mechanism 32 is reduced or the rotation of the substrate 9 is stopped so that the third processing liquid puddles (i.e., a puddle of the third processing liquid is formed) on the upper surface 91 of the substrate 9. At this time, the cup part 4 is slightly moved upward from the second position illustrated in FIG. 4 so as to reduce the flow rate of the gas exhausted from the chamber 6 as described above. Accordingly, the shape of a liquid film of the third processing liquid on the substrate 9 can be properly maintained, and the above substitution processing can be properly performed.

After the substitution processing has ended, the cup part 4 is moved back to the second position, and the rotational speed of the substrate 9 is increased. Thus, the third processing liquid is dispersed and removed from above the substrate 9 to the surroundings, and dry processing is performed on the substrate 9. In the dry processing, the flow rate of the gas exhausted from the chamber 6 becomes higher than in the substitution processing, because the cup part 4 is located at the second position as described above. As a result, the dry processing of the substrate 9 can be finished in a short time.

Figure 11:
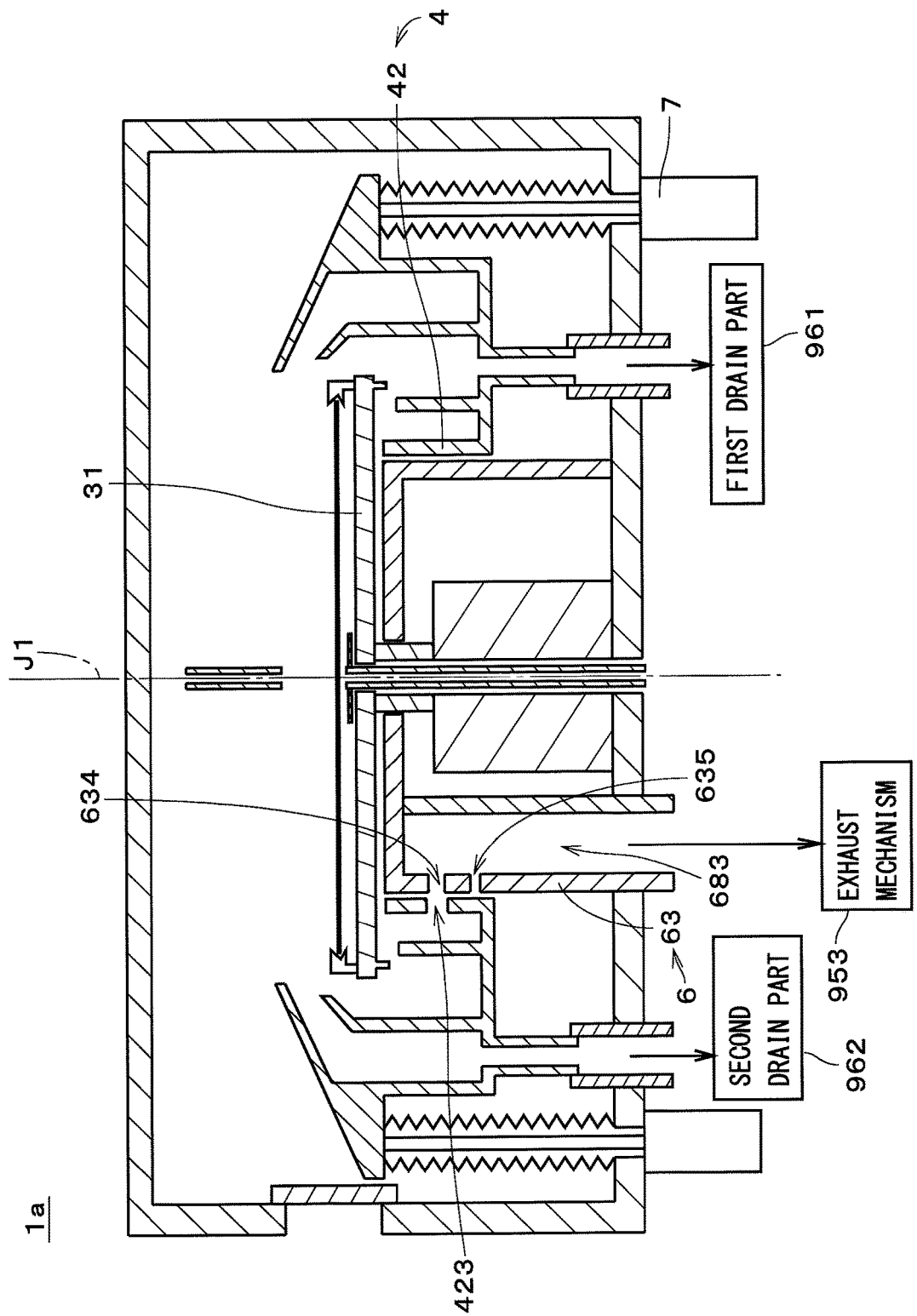
FIG. 11 is a longitudinal cross-sectional view of a substrate processing apparatus according to a second embodiment.
Figure 12:
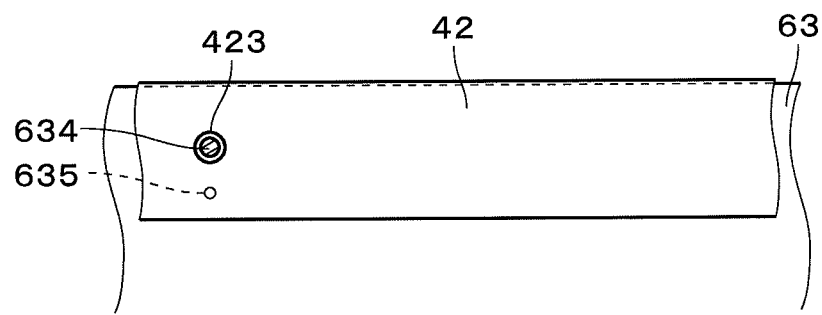
FIG. 12 illustrates part of a cup inner side-wall portion and a chamber inner side-wall portion in developed form.

FIG. 11 is a longitudinal cross-sectional view of a substrate processing apparatus 1a according to a second embodiment of the present invention. FIG. 12 illustrates part of the outer side surfaces of the cup inner side-wall portion 42 and the chamber inner side-wall portion 63 illustrated in FIG. 11 in developed form. The substrate processing apparatus 1a does not perform switching between the exhaust destinations of the gas from the cup part 4, but changes the flow rate of the gas exhausted from the cup part 4.

In the substrate processing apparatus 1a illustrated in FIG. 11, the cup inner side-wall portion 42 has a single cup exhaust port 423, instead of the first cup exhaust port 421 and the second cup exhaust port 422 of the substrate processing apparatus 1 illustrated in FIG. 1. In the substrate processing apparatus 1a, the chamber inner side-wall portion 63 has a large chamber exhaust port 634 and a small chamber exhaust port 635, instead of the first chamber exhaust port 631 and the second chamber exhaust port 632. The substrate processing apparatus 1*a* further includes a single exhaust gas duct 683, instead of the first duct 681 and the second duct 682, and includes a single exhaust mechanism 953, instead of the first exhaust mechanism 951 and the second exhaust mechanism 952. Except for these points, the substrate processing apparatus 1*a* has approximately the same structure as that of the substrate processing apparatus 1 illustrated in FIG. 1. In the following description, constituent elements of the substrate processing apparatus 1*a* that correspond to those of the substrate processing apparatus 1 are given the same reference numerals.

The small chamber exhaust port 635 is located at the same circumferential position as that of the large chamber exhaust port 634 and aligned in the up-down direction with the large chamber exhaust port 634. In the example illustrated in FIG. 11, the small chamber exhaust port 635 is spaced from the large chamber exhaust port 634 and located below the large chamber exhaust port 634. The cross-sectional area of the small chamber exhaust port 635 is smaller than the cross-sectional area of the large chamber exhaust port 634. Here, the cross-sectional area refers to the area of a cross section perpendicular to the flow passage of each chamber exhaust port. In the following description, the large chamber exhaust port 634 and the small chamber exhaust port 635 are also collectively referred to as a "chamber exhaust port." In other words, the chamber exhaust port includes the large chamber exhaust port 634 and the small chamber exhaust port 635. When there is no particular need to distinguish between the large chamber exhaust port 634 and the small chamber exhaust port 635, one of the large chamber exhaust port 634 and the small chamber exhaust port 635 may be referred to as a "chamber exhaust port."

The large chamber exhaust port 634 and the small chamber exhaust port 635 are connected to the exhaust duct 683 that extends in the up-down direction on the radially inner side of the chamber inner side-wall portion 63, and the exhaust duct 683 is connected to the exhaust mechanism 953. The exhaust mechanism 953 is disposed outside the chamber 6 and the substrate processing apparatus 1*a*. While the substrate processing apparatus 1*a* is in use, the exhaust mechanism 953 continuously carries out suction at a constant output.

The cup exhaust port 423 is disposed at the same circumferential position as those of the large chamber exhaust port 634 and the small chamber exhaust port 635. The cross-sectional area of the cup exhaust port 423 is larger than the cross-sectional area of the small chamber exhaust port 635. In the example illustrated in FIGS. 11 and 12, the cross-sectional area of the cup exhaust port 423 is larger than the cross-sectional area of the large chamber exhaust port 634. Alternatively, the cross-sectional area of the cup exhaust port 423 may be smaller than the cross-sectional area of the large chamber exhaust port 634.

In the state in which the cup part 4 is located at the first position illustrated in FIG. 11, the cup exhaust port 423 overlaps the large chamber exhaust port 634, and the small chamber exhaust port 635 is substantially closed by the cup inner side-wall portion 42, as illustrated in FIGS. 11 and 12. In this state, the gas in the cup part 4 is discharged through the cup exhaust port 423, the large chamber exhaust port 634, and the exhaust duct 683 to the outside of the chamber 6 by the exhaust mechanism 953 connected to the large chamber exhaust port 634.

Figure 13:
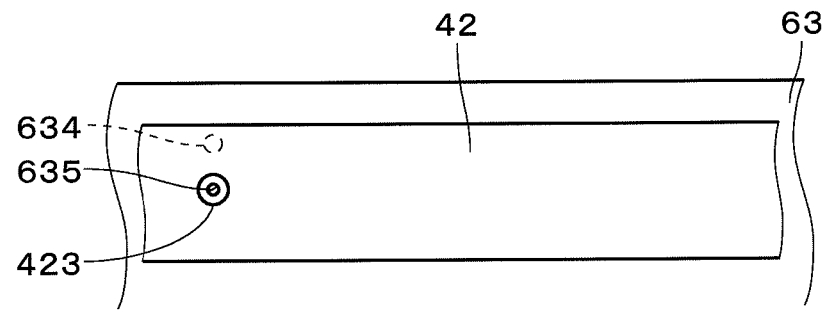
FIG. 13 illustrates part of the cup inner side-wall portion and the chamber inner side-wall portion in developed form.

In the state in which the cup part 4 is moved down from the first position and located at the second position (see FIG. 4), the cup exhaust port 423 overlaps the small chamber exhaust port 635, and the large chamber exhaust port 634 is substantially closed by the cup inner side-wall portion 42, as illustrated in FIG. 13. In this state, the gas in the cup part 4 is discharged through the cup exhaust port 423, the small chamber exhaust port 635, and the exhaust duct 683 to the outside of the chamber 6 by the exhaust mechanism 953 connected to the small chamber exhaust port 635.

In the case where the cup exhaust port 423 overlaps the entire small chamber exhaust port 635, the area of overlap between the cup exhaust port 423 and the chamber exhaust port (i.e., the large chamber exhaust port 634 and the small chamber exhaust port 635) is smaller than in the case where the cup exhaust port 423 overlaps the entire large chamber exhaust port 634. In this case, the discharge of the gas in the cup part 4 by the exhaust mechanism 953 is suppressed, and the flow rate of the gas exhausted from inside the chamber 6 to the outside of the chamber 6 is reduced.

In this way, in the substrate processing apparatus 1*a*, the gas in the cup part 4 is discharged through the cup exhaust port 423 and the chamber exhaust port (i.e., the large chamber exhaust port 634 or the small chamber exhaust port 635) to the outside of the chamber 6 by the exhaust mechanism 953 connected to the chamber exhaust port, while the cup exhaust port 423 overlaps the chamber exhaust port. The flow rate of the gas exhausted from the chamber 6 by the exhaust mechanism 953 is changed by the controller 10 controlling the cup elevating mechanism 7 to change the area of overlap between the cup exhaust port 423 and the chamber exhaust port.

The substrate processing apparatus 1*a* can easily change the flow rate of the gas exhausted from the chamber 6, without changing the output of the exhaust mechanism 953, by changing the position in the up-down direction of the cup part 4. In the substrate processing apparatus 1*a*, the area of overlap between the cup exhaust port 423 and the chamber exhaust port can be changed by causing the cup exhaust port 423 to selectively overlap the large chamber exhaust port 634 or the small chamber exhaust port 635. This configuration simplifies the process of changing the flow rate of the gas exhausted from the chamber 6 (i.e., switching between the flow rates of the exhaust gas).

Figure 14:
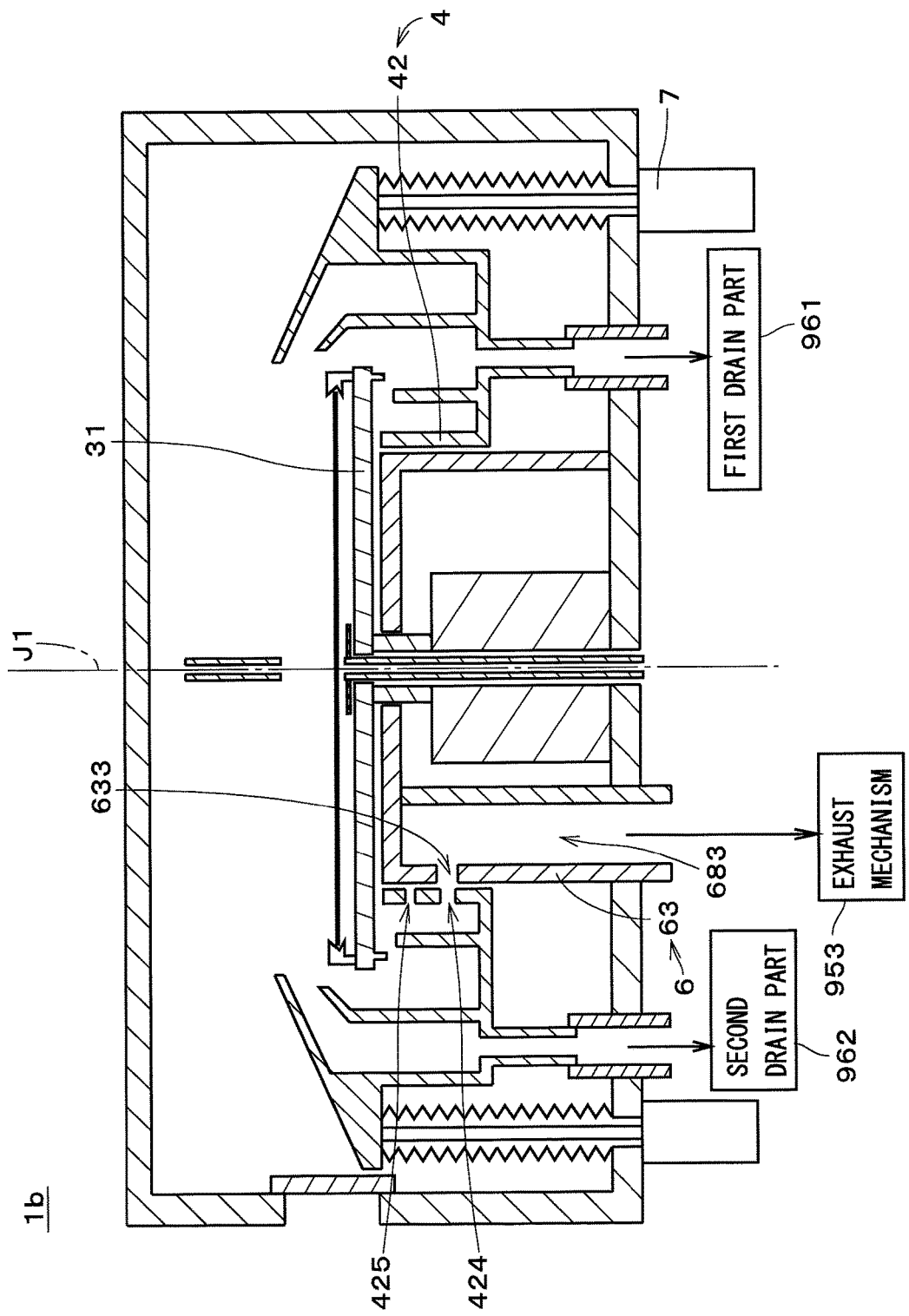
FIG. 14 is a longitudinal cross-sectional view of a substrate processing apparatus according to a third embodiment.
Figure 15:
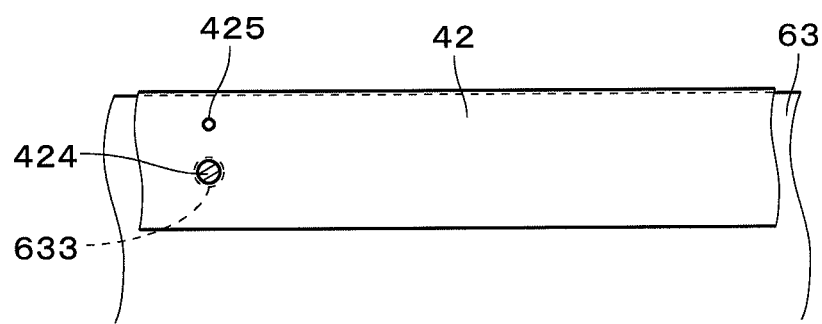
FIG. 15 illustrates part of a cup inner side-wall portion and a chamber inner side-wall portion in developed form.

FIG. 14 is a longitudinal cross-sectional view of a substrate processing apparatus 1*b* according to a third embodiment of the present invention. FIG. 15 illustrates part of the outer side surfaces of the cup inner side-wall portion 42 and the chamber inner side-wall portion 63 illustrated in FIG. 14 in developed form. Like the substrate processing apparatus 1*a* illustrated in FIG. 11, the substrate processing apparatus 1*b* changes the flow rate of the gas exhausted from the cup part 4, without performing switching between the exhaust destinations of the gas from the cup part 4.

In the substrate processing apparatus 1*b* illustrated in FIG. 14, the cup inner side-wall portion 42 has a large cup exhaust port 424 and a small cup exhaust port 425, instead of the cup exhaust port 423 of the substrate processing apparatus 1*a* illustrated in FIG. 11. In the substrate processing apparatus 1*b*, the chamber inner side-wall portion 63 has a single chamber exhaust port 633, instead of the large chamber exhaust port 634 and the small chamber exhaust port 635 illustrated in FIG. 11. Except for these points, the substrate processing apparatus 1*b* has approximately the same structure as that of the substrate processing apparatus 1*a* illustrated in FIG. 11. In the following description, constituent elements of the substrate processing apparatus 1*b* that correspond to those of the substrate processing apparatus 1*a* are given the same reference numerals.

The small cup exhaust port 425 is located at the same circumferential position as that of the large cup exhaust port 424 and aligned in the up-down direction with the large cup exhaust port 424. In the example illustrated in FIG. 14, the small cup exhaust port 425 is spaced from the large cup exhaust port 424 and located above the large cup exhaust port 424. The cross-sectional area of the small cup exhaust port 425 is smaller than the cross-sectional area of the large cup exhaust port 424. Here, the cross-sectional area refers to the area of a cross section perpendicular to the flow passage of each cup exhaust ports. In the following description, the large cup exhaust port 424 and the small cup exhaust port 425 are also collectively referred to as a "cup exhaust port." In other words, the cup exhaust port includes the large cup exhaust port 424 and the small cup exhaust port 425. When there is no particular need to distinguish between the large cup exhaust port 424 and the small cup exhaust port 425, one of the large cup exhaust port 424 and the small cup exhaust port 425 may be referred to as a "cup exhaust port."

The chamber exhaust port 633 is located at the same circumferential position as those of the large cup exhaust port 424 and the small cup exhaust port 425. The cross-sectional area of the chamber exhaust port 633 is larger than the cross-sectional area of the small cup exhaust port 425. In the example illustrated in FIGS. 14 and 15, the cross-sectional area of the chamber exhaust port 633 is larger than the cross-sectional area of the large cup exhaust port 424. Alternatively, the cross-sectional area of the chamber exhaust port 633 may be smaller than the cross-sectional area of the large cup exhaust port 424. The chamber exhaust port 633 is connected to an exhaust duct 683 that extends in the up-down direction on the radially inner side of the chamber inner side-wall portion 63, and the exhaust duct 683 is connected to an exhaust mechanism 953. The exhaust mechanism 953 is disposed outside the chamber 6 and the substrate processing apparatus 1b. While the substrate processing apparatus 1b is in use, the exhaust mechanism 953 continuously carries out suction at a constant output.

In the state in which the cup part 4 is located at the first position illustrated in FIG. 14, the large cup exhaust port 424 overlaps the chamber exhaust port 633, and the small cup exhaust port 425 is substantially closed by the chamber inner side-wall portion 63, as illustrated in FIGS. 14 and 15. In this state, the gas in the cup part 4 is discharged through the large cup exhaust port 424, the chamber exhaust port 633, and the exhaust duct 683 to the outside of the chamber 6 by the exhaust mechanism 953 connected to the chamber exhaust port 633.

Figure 16:
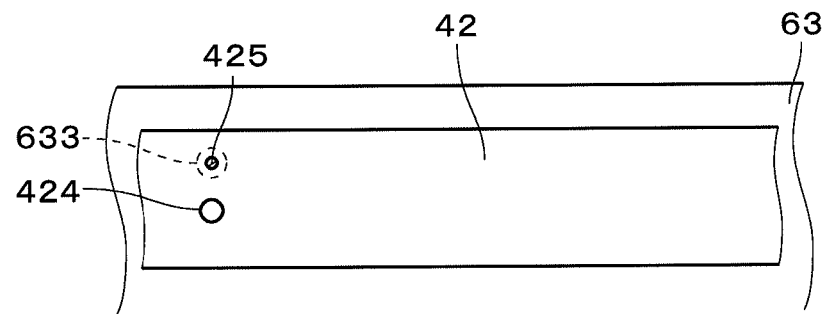
FIG. 16 illustrates part of the cup inner side-wall portion and the chamber inner side-wall portion in developed form.

In the state in which the cup part 4 is moved down from the first position and located at the second position (see FIG. 4), the small cup exhaust port 425 overlaps the chamber exhaust port 633, and the large cup exhaust port 424 is substantially closed by the chamber inner side-wall portion 63, as illustrated in FIG. 16. In this state, the gas in the cup part 4 is discharged through the small cup exhaust port 425, the chamber exhaust port 633, and the exhaust duct 683 to the outside of chamber 6 by the exhaust mechanism 953 connected to the chamber exhaust port 633.

In the case where the entire small cup exhaust port 425 overlaps the chamber exhaust port 633, the area of overlap between the cup exhaust port (i.e., the large cup exhaust port 424 and the small cup exhaust port 425) and the chamber exhaust port 633 is smaller than in the case where the entire large cup exhaust port 424 overlaps the chamber exhaust port 633. In this case, the discharge of the gas in the cup part 4 by the exhaust mechanism 953 is suppressed, and the flow rate of the gas exhausted from inside the chamber 6 to the outside of the chamber 6 is reduced.

In this way, in the substrate processing apparatus 1b, the gas in the cup part 4 is discharged through the cup exhaust port (i.e., the large cup exhaust port 424 or the small cup exhaust port 425) and the chamber exhaust port 633 to the outside of the chamber 6 by the exhaust mechanism 953 connected to the chamber exhaust port 633, while the cup exhaust port overlaps the chamber exhaust port 633. The flow rate of the gas exhausted from the chamber 6 by the exhaust mechanism 953 is changed by the controller 10 controlling the cup elevating mechanism 7 to change the area of overlap between the cup exhaust port and the chamber exhaust port 633.

The substrate processing apparatus 1b can easily change the flow rate of the gas exhausted from the chamber 6, without changing the output of the exhaust mechanism 953, by changing the position in the up-down direction of the cup part 4. In the substrate processing apparatus 1b, the area of overlap between the cup exhaust port and the chamber exhaust port 633 can be changed by selectively causing the large cup exhaust port 424 or the small cup exhaust port 425 to overlap the chamber exhaust port 633. This configuration simplifies the process of changing the flow rate of the gas exhausted from the chamber 6 (i.e., switching between the flow rates of the exhaust gas).

Like the substrate processing apparatus 1a illustrated in FIG. 11, the substrate processing apparatus 1 illustrated in FIG. 1 may also change the flow rate of the gas exhausted from the chamber 6 by causing the cup exhaust port to selectively overlap the large chamber exhaust port or the small chamber exhaust port and thereby changing the area of overlap between the cup exhaust port and the chamber exhaust port.

Figure 17:
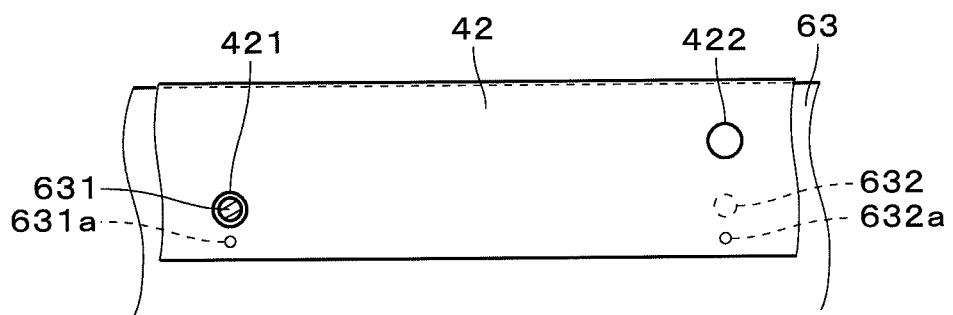
FIG. 17 illustrates part of the cup inner side-wall portion and the chamber inner side-wall portion in developed form.

For example, as illustrated in FIG. 17, the chamber inner side-wall portion 63 may have another first chamber exhaust port 631a below the first chamber exhaust port 631, the first chamber exhaust port 631a having a cross-sectional area smaller than that of the first chamber exhaust port 631. Like the first chamber exhaust port 631, the first chamber exhaust port 631a is also connected to the first exhaust mechanism 951 (see FIG. 1). In this case, the first chamber exhaust ports 631 and 631a correspond respectively to a large chamber exhaust port and a small chamber exhaust port. Then, the area of overlap between the first cup exhaust port 421 and the first chamber exhaust port is changed by causing the first cup exhaust port 421 to selectively overlap the first chamber exhaust port 631 or the first chamber exhaust port 631a. This facilitates changing the flow rate of the gas exhausted from the chamber 6.

As another alternative, the chamber inner side-wall portion 63 may have another second chamber exhaust port 632a below the second chamber exhaust port 632, the second chamber exhaust port 632a having a cross-sectional area smaller than that of the second chamber exhaust port 632. Like the second chamber exhaust port 632, the second chamber exhaust port 632a is also connected to the second exhaust mechanism 952 (see FIG. 1). In this case, the second chamber exhaust ports 632 and 632a correspond respectively to a large chamber exhaust port and a small chamber exhaust port. Then, the area of overlap between the second cup exhaust port 422 and a second chamber exhaust port is changed by causing the second cup exhaust port 422 to selectively overlap the second chamber exhaust port 632 or the second chamber exhaust port 632a. This facilitates changing the flow rate of the gas exhausted from the chamber 6.

Like the substrate processing apparatus 1*b* illustrated in FIG. 14, the substrate processing apparatus 1 illustrated in FIG. 1 may also change the flow rate of the gas exhausted from the chamber 6 by selectively causing the large cup exhaust port or the small cup exhaust port to overlap the chamber exhaust port and thereby changing the area of overlap between the cup exhaust port and the chamber exhaust port.

Figure 18:
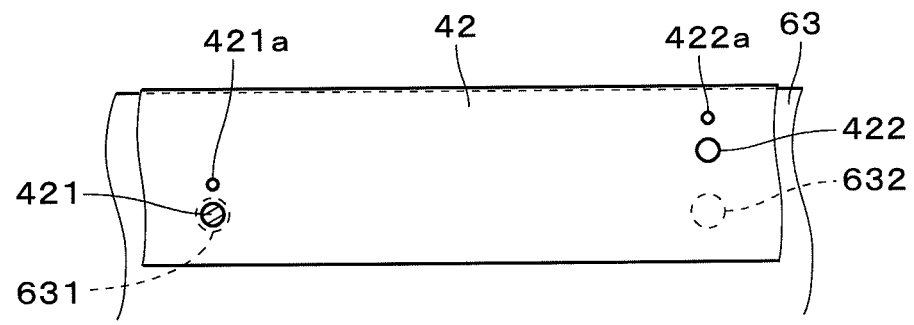
FIG. 18 illustrates part of the cup inner side-wall portion and the chamber inner side-wall portion in developed form.

For example, as illustrated in FIG. 18, the cup inner side-wall portion 42 may have another first cup exhaust port 421*a* above the first cup exhaust port 421, the first cup exhaust port 421*a* having a cross-sectional area smaller than that of the first cup exhaust port 421. In this case, the first cup exhaust ports 421 and 421*a* correspond respectively to a large cup exhaust port and a small cup exhaust port. Then, the area of overlap between the first cup exhaust port and the first chamber exhaust port 631 is changed by selectively causing the first cup exhaust port 421 or the first cup exhaust port 421*a* to overlap the first chamber exhaust port 631. This facilitates changing the flow rate of the gas exhausted from the chamber 6.

As another alternative, the cup inner side-wall portion 42 may have another second cup exhaust port 422*a* above the second cup exhaust port 422, the second cup exhaust port 422*a* having a cross-sectional area smaller than that of the second cup exhaust port 422. In this case, the second cup exhaust ports 422 and 422*a* correspond respectively to a large cup exhaust port and a small cup exhaust port. Then, the area of overlap between the second cup exhaust port and the second chamber exhaust port 632 is changed by selectively causing the second cup exhaust port 422 or the second cup exhaust port 422*a* to overlap the second chamber exhaust port 632. This facilitates changing the flow rate of the gas exhausted from the chamber 6.

Figure 19:
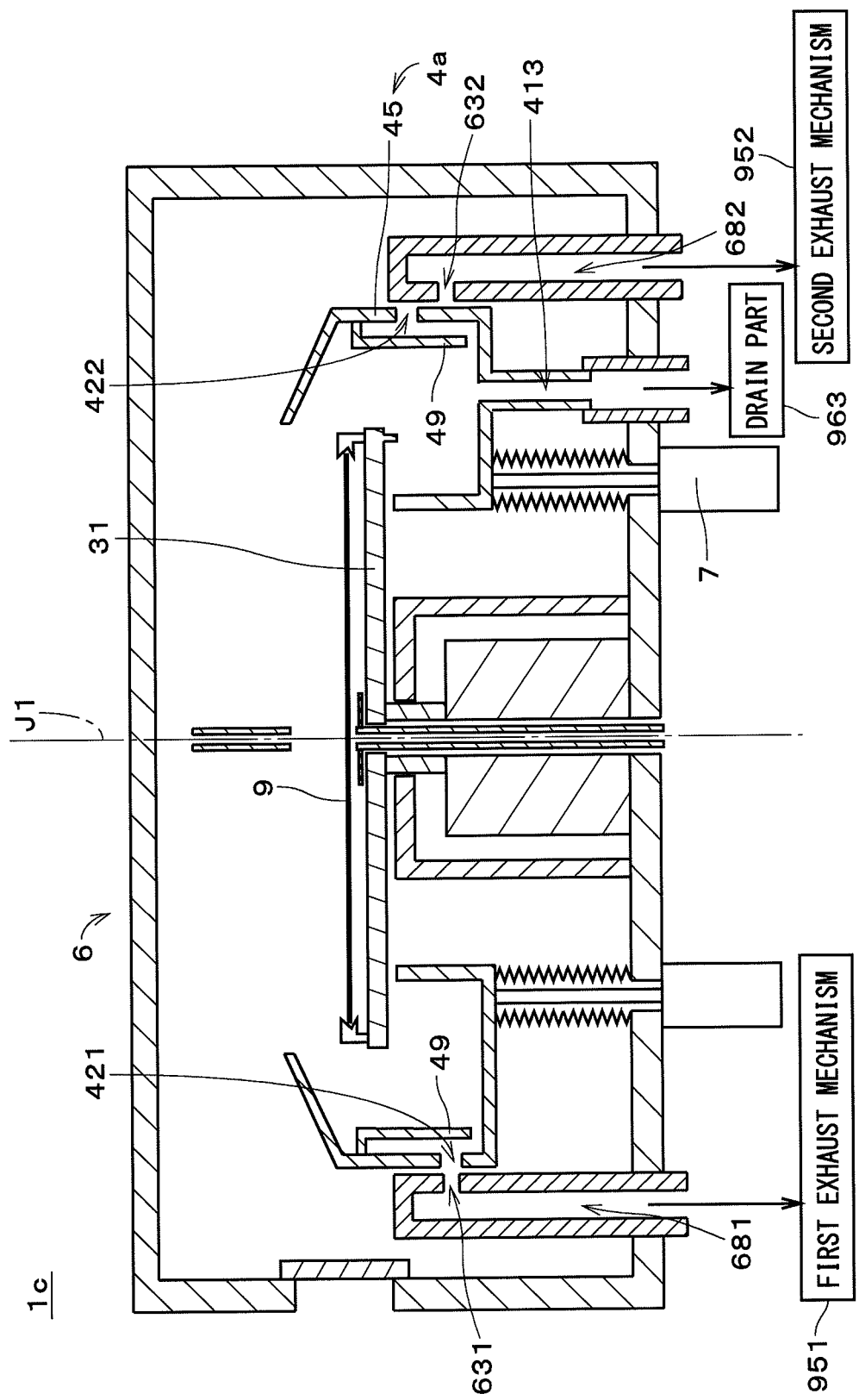
FIG. 19 is a longitudinal cross-sectional view of a substrate processing apparatus according to a fourth embodiment.

FIG. 19 is a longitudinal cross-sectional view of a substrate processing apparatus 1*c* according to a fourth embodiment of the present invention. The substrate processing apparatus 1*c* includes a cup part 4*a* whose shape is different from that of the cup part 4 illustrated in FIG. 1, within the chamber 6. The cup part 4*a* omits the cup intermediate wall portion 44 of the cup part 4 illustrated in FIG. 1 and has a single cup drain port 413, instead of the first cup drain port 411 and the second cup drain port 412. Liquids flowing into the cup part 4*a* are discharged through the cup drain port 413 and a chamber drain port 613 to a drain part 963.

The cup part 4*a* also has a first cup exhaust port 421 and a second cup exhaust port 422 in the cup outer side-wall portion 45. The cup part 4*a* preferably has a cover part 49 that extends radially inward from the upper end portion of the cup outer side-wall portion 45 and then extends downward so as to radially oppose the first cup exhaust port 421 and the second cup exhaust port 422. The cover part 49 preferably covers the opposite sides in the circumferential direction of the first cup exhaust port 421 and the second cup exhaust port 422. The presence of the cover part 49 suppresses the entry of the processing liquid dispersed from the substrate 9 into the first cup exhaust port 421 and the second cup exhaust port 422. The cover part 49 is preferably provided in substrate processing apparatuses 1*d* and 1*e*, which will be described later.

A first duct 681 and a second duct 682, which are part of the chamber 6, are provided outward (i.e., on the radially outer side) of the cup outer side-wall portion 45. The first duct 681 has a first chamber exhaust port 631 in its side wall portion, the first chamber exhaust port 631 radially opposing the cup outer side-wall portion 45, and the second duct 682 has a second chamber exhaust port 632 in its side wall portion, the second chamber exhaust port 632 radially opposing the cup outer side-wall portion 45. Except for these points, the substrate processing apparatus 1*c* has approximately the same structure as that of the substrate processing apparatus 1 illustrated in FIG. 1. In the following description, constituent elements of the substrate processing apparatus 1*c* that correspond to those of the substrate processing apparatus 1 are given the same reference numerals.

In the example illustrated in FIG. 19, the first chamber exhaust port 631 and the second chamber exhaust port 632 are located at approximately the same position in the up-down direction. The second chamber exhaust port 632 is located at a circumferential position different from that of the first chamber exhaust port 631. To be more specific, the second chamber exhaust port 632 is located at a circumferential position shifted by 180 degrees from that of the first chamber exhaust port 631 (i.e., at a radially opposite position with the central axis J1 in between).

In the example illustrated in FIG. 19, the position in the up-down direction of the second cup exhaust port 422 is different from the position in the up-down direction of the first cup exhaust port 421. The second cup exhaust port 422 is located above the first cup exhaust port 421. The second cup exhaust port 422 is located at a circumferential position different from that of the first cup exhaust port 421. To be more specific, the second cup exhaust port 422 is located at a circumferential position shifted by 180 degrees from that of the first cup exhaust port 421 (i.e., at a radially opposite position with the central axis J1 in between). The first cup exhaust port 421 is located at the same circumferential position as that of the first chamber exhaust port 631. The second cup exhaust port 422 is located at the same circumferential position as that of the second chamber exhaust port 632.

In the state illustrated in FIG. 19, the first cup exhaust port 421 radially opposes and overlaps the first chamber exhaust port 631. The second cup exhaust port 422 is located above the second chamber exhaust port 632 and substantially closed by the side wall portion of the second duct 682. In the state in which the first cup exhaust port 421 overlaps the first chamber exhaust port 631, the gas in the cup part 4*a* is discharged through the first cup exhaust port 421, the first chamber exhaust port 631, and the first duct 681 to the outside of the chamber 6 by the first exhaust mechanism 951 connected to the first chamber exhaust port 631.

Figure 20:
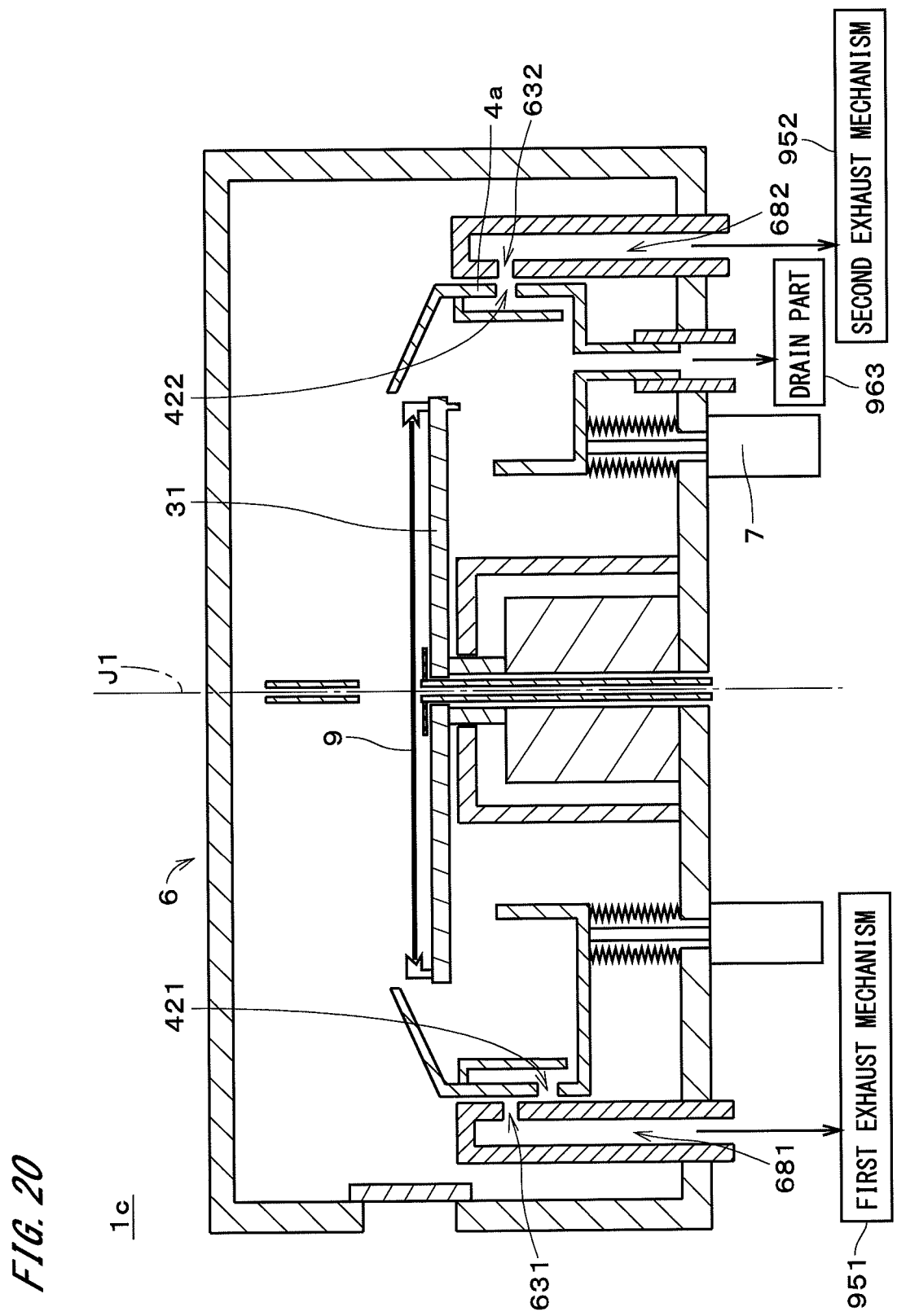
FIG. 20 is a longitudinal cross-sectional view of the substrate processing apparatus.

When the cup part 4*a* is moved down from the position illustrated in FIG. 19 and located at a position illustrated in FIG. 20 by the cup elevating mechanism 7, the second cup exhaust port 422 radially opposes and overlaps the second chamber exhaust port 632. The first cup exhaust port 421 is located below the first chamber exhaust port 631 and substantially closed by the side wall portion of the first duct 681. In the state in which the second cup exhaust port 422 overlaps the second chamber exhaust port 632, the gas in the cup part 4*a* is discharged through the second cup exhaust port 422, the second chamber exhaust port 632, and the second duct 682 to the outside of the chamber 6 by the second exhaust mechanism 952 connected to the second chamber exhaust port 632.

Like the substrate processing apparatus 1 illustrated in FIG. 1, the substrate processing apparatus 1*c* can easily switch the exhaust mechanism for exhausting the gas from the cup part 4*a* between the first exhaust mechanism 951 and the second exhaust mechanism 952 by causing the cup elevating mechanism 7 to move the cup part 4*a* relative to the substrate holder 31 in the up-down direction within the chamber 6, without opening the chamber 6. Besides, the exhaust destinations of the gas from the cup part 4a can be switched with a simply structured mechanism, which simplifies the structure of the substrate processing apparatus 1c.

Figure 21:
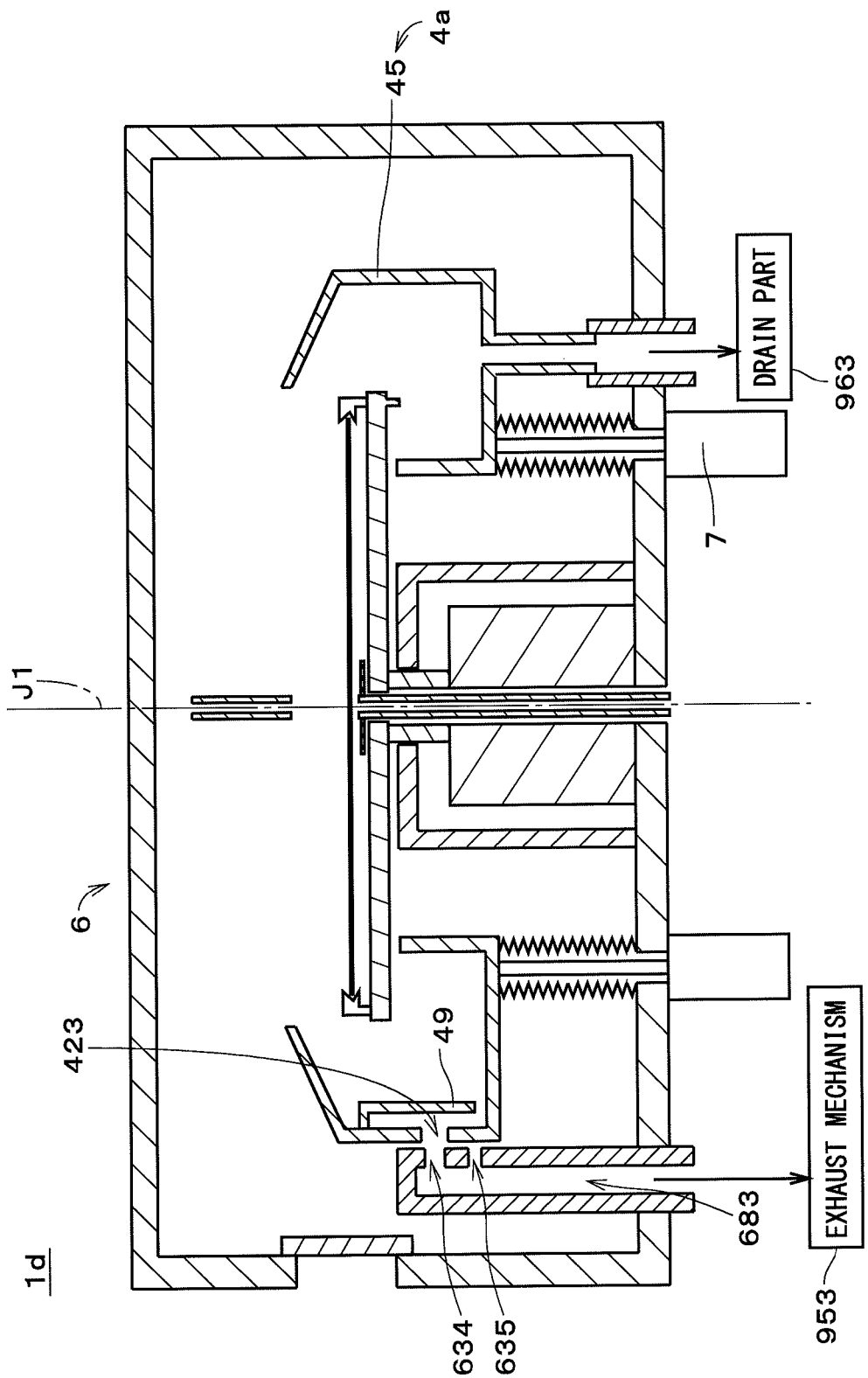
FIG. 21 is a longitudinal cross-sectional view of a substrate processing apparatus according to a fifth embodiment.

FIG. 21 is a longitudinal cross-sectional view of a substrate processing apparatus 1d according to a fifth embodiment of the present invention. Like the substrate processing apparatus 1a illustrated in FIG. 11, the substrate processing apparatus 1d does not perform switching between the exhaust destinations of the gas from the cup part 4a, but changes the flow rate of the gas exhausted from the cup part 4a.

The substrate processing apparatus 1d illustrated in FIG. 21 has a single cup exhaust port 423 in the cup outer side-wall portion 45, instead of the first cup exhaust port 421 and the second cup exhaust port 422 of the substrate processing apparatus 1c illustrated in FIG. 19. The substrate processing apparatus 1d further includes a single exhaust duct 683, instead of the first duct 681 and the second duct 682, and includes a single exhaust mechanism 953, instead of the first exhaust mechanism 951 and the second exhaust mechanism 952. Moreover, the exhaust duct 683 has a large chamber exhaust port 634 and a small chamber exhaust port 635 in its side wall portion, instead of the first chamber exhaust port 631 and the second chamber exhaust port 632. Except for these points, the substrate processing apparatus 1d has approximately the same structure as that of the substrate processing apparatus 1c illustrated in FIG. 19. In the following description, constituent elements of the substrate processing apparatus 1d that correspond to those of the substrate processing apparatus 1c are given the same reference numerals.

The small chamber exhaust port 635 is located at the same circumferential position as that of the large chamber exhaust port 634 and aligned in the up-down direction with the large chamber exhaust port 634. In the example illustrated in FIG. 21, the small chamber exhaust port 635 is spaced from the large chamber exhaust port 634 and located below the large chamber exhaust port 634. The cross-sectional area of the small chamber exhaust port 635 is smaller than the cross-sectional area of the large chamber exhaust port 634. The large chamber exhaust port 634 and the small chamber exhaust port 635 are connected to the exhaust mechanism 953 through the exhaust duct 683 that extends in the up-down direction on the radially outer side of the cup outer side-wall portion 45.

The cup exhaust port 423 is located at the same circumferential position as those of the large chamber exhaust port 634 and the small chamber exhaust port 635. The cross-sectional area of the cup exhaust port 423 is larger than the cross-sectional area of the small chamber exhaust port 635. In the example illustrated in FIG. 21, the cross-sectional area of the cup exhaust port 423 is larger than the cross-sectional area of the large chamber exhaust port 634. Alternatively, the cross-sectional area of the cup exhaust port 423 may be smaller than the cross-sectional area of the large chamber exhaust port 634.

In the state illustrated in FIG. 21, the cup exhaust port 423 radially opposes and overlaps the large chamber exhaust port 634. The small chamber exhaust port 635 is substantially closed by the cup outer side-wall portion 45. In this state, the gas in the cup part 4a is discharged through the cup exhaust port 423, the large chamber exhaust port 634, and the exhaust duct 683 to the outside of the chamber 6 by the exhaust mechanism 953.

When the cup part 4a is moved down from the position illustrated in FIG. 21 by the cup elevating mechanism 7 so that the cup exhaust port 423 radially opposes and overlaps the small chamber exhaust port 635, the large chamber exhaust port 634 is substantially closed by the cup outer side-wall portion 45. In this state, the gas in the cup part 4a is discharged through the cup exhaust port 423, the small chamber exhaust port 635, and the exhaust duct 683 to the outside of the chamber 6 by the exhaust mechanism 953.

Like the substrate processing apparatus 1a illustrated in FIG. 11, the substrate processing apparatus 1d can easily change the flow rate of the gas exhausted from the chamber 6, without changing the output of the exhaust mechanism 953, by changing the position in the up-down direction of the cup part 4a. In the substrate processing apparatus 1d, the area of overlap between the cup exhaust port 423 and the chamber exhaust port can be changed by causing the cup exhaust port 423 to selectively overlap the large chamber exhaust port 634 or the small chamber exhaust port 635. This configuration simplifies the process of changing the flow rate of the gas exhausted from the chamber 6 (i.e., switching between the flow rates of the exhaust gas).

Figure 22:
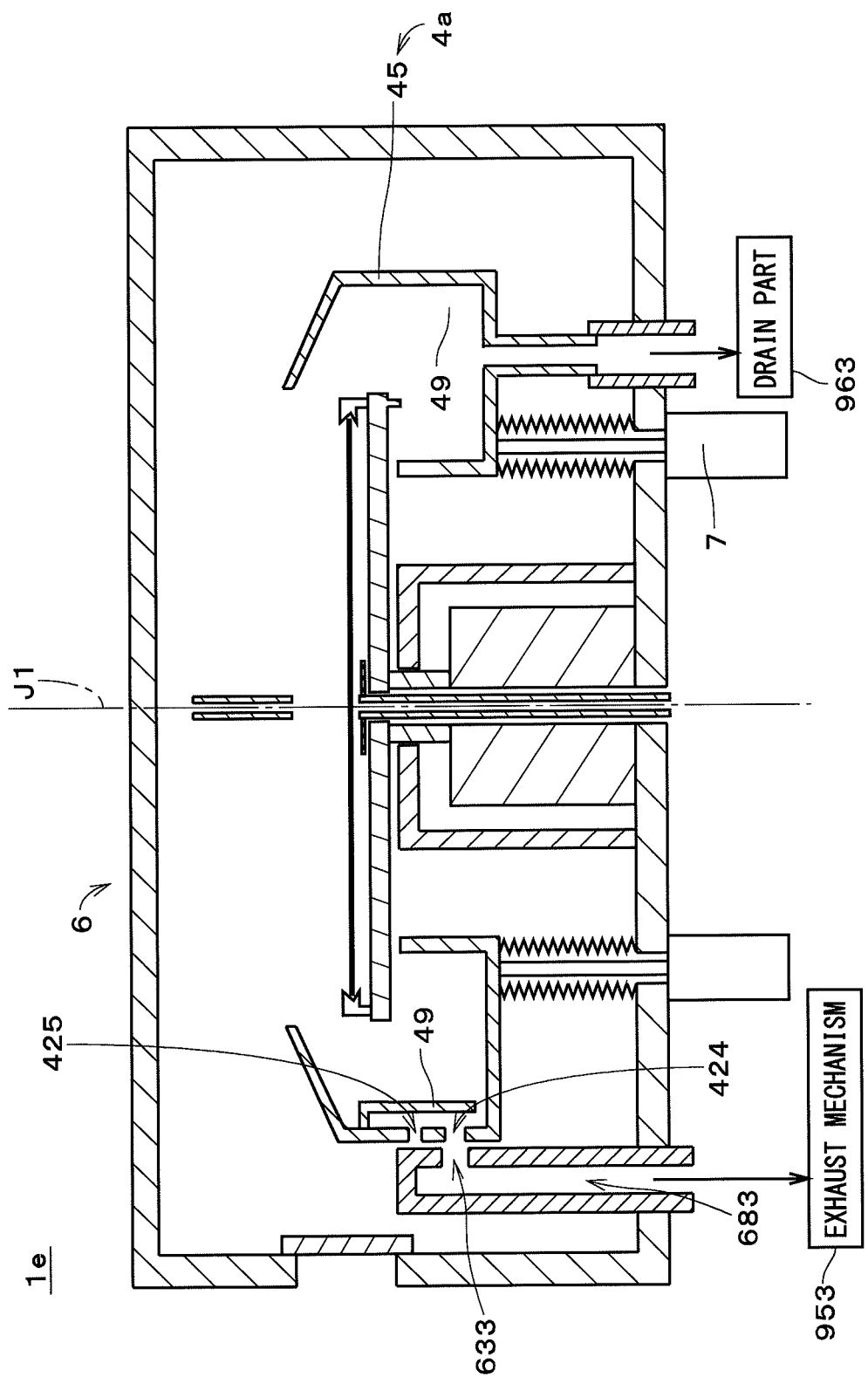
FIG. 22 is a longitudinal cross-sectional view of a substrate processing apparatus according to a sixth embodiment.

FIG. 22 is a longitudinal cross-sectional view of a substrate processing apparatus 1e according to a sixth embodiment of the present invention. Like the substrate processing apparatus 1d illustrated in FIG. 21, the substrate processing apparatus 1e does not perform switching between the exhaust destinations of the gas from the cup part 4a, but changes the flow rate of the gas exhausted from the cup part 4a.

The substrate processing apparatus 1e illustrated in FIG. 22 has a large cup exhaust port 424 and a small cup exhaust port 425 in the cup outer side-wall portion 45, instead of the cup exhaust port 423 of the substrate processing apparatus 1d illustrated in FIG. 21. The substrate processing apparatus 1e further has a single chamber exhaust port 633 in the side wall portion of the exhaust duct 683, instead of the large chamber exhaust port 634 and the small chamber exhaust port 635 illustrated in FIG. 21. Except for these points, the substrate processing apparatus 1e has approximately the same structure as that of the substrate processing apparatus 1d illustrated in FIG. 21. In the following description, constituent elements of the substrate processing apparatus 1e that correspond to those of the substrate processing apparatus 1d are given the same reference numerals.

The small cup exhaust port 425 is located at the same circumferential position as that of the large cup exhaust port 424 and aligned in the up-down direction with the large cup exhaust port 424. In the example illustrated in FIG. 22, the small cup exhaust port 425 is spaced from the large cup exhaust port 424 and located above the large cup exhaust port 424. The cross-sectional area of the small cup exhaust port 425 is smaller than the cross-sectional area of the large cup exhaust port 424.

The chamber exhaust port 633 is located at the same circumferential position as those of the large cup exhaust port 424 and the small cup exhaust port 425. The cross-sectional area of the chamber exhaust port 633 is larger than the cross-sectional area of the small cup exhaust port 425. In the example illustrated in FIG. 22, the cross-sectional area of the chamber exhaust port 633 is larger than the cross-sectional area of the large cup exhaust port 424. Alternatively, the cross-sectional area of the chamber exhaust port 633 may be smaller than the cross-sectional area of the large cup exhaust port 424. The chamber exhaust port 633 is connected to the exhaust mechanism 953 via the exhaust duct 683 that extends in the up-down direction on the radially outer side of the cup outer side-wall portion 45.

In the state illustrated in FIG. 22, the large cup exhaust port 424 radially opposes and overlaps the chamber exhaust port 633. The small cup exhaust port 425 is substantially closed by the side wall portion of the exhaust duct 683. In this state, the gas in the cup part 4a is discharged through the large cup exhaust port 424, the chamber exhaust port 633, and the exhaust duct 683 to the outside of the chamber 6 by the exhaust mechanism 953.

When the cup part 4a is moved down from the position illustrated in FIG. 22 by the cup elevating mechanism 7 so that the small cup exhaust port 425 radially opposes and overlaps the chamber exhaust port 633, the large cup exhaust port 424 is substantially closed by the side wall portion of the exhaust duct 683. In this state, the gas in the cup part 4a is discharged through the small cup exhaust port 425, the chamber exhaust port 633, and the exhaust duct 683 to the outside of the chamber 6 by the exhaust mechanism 953.

Like the substrate processing apparatus 1d illustrated in FIG. 21, the substrate processing apparatus 1e can easily change the flow rate of the gas exhausted from the chamber 6, without changing the output of the exhaust mechanism 953, by changing the position in the up-down direction of the cup part 4a. In the substrate processing apparatus 1e, the area of overlap between the cup exhaust port and the chamber exhaust port 633 can be changed by selectively causing the large cup exhaust port 424 or the small cup exhaust port 425 to overlap the chamber exhaust port 633. This configuration simplifies the process of changing the flow rate of the gas exhausted from the chamber 6 (i.e., switching between the flow rates of the exhaust gas).

The substrate processing apparatuses 1 and 1a to 1e described above may be modified in various ways.

Figure 23:
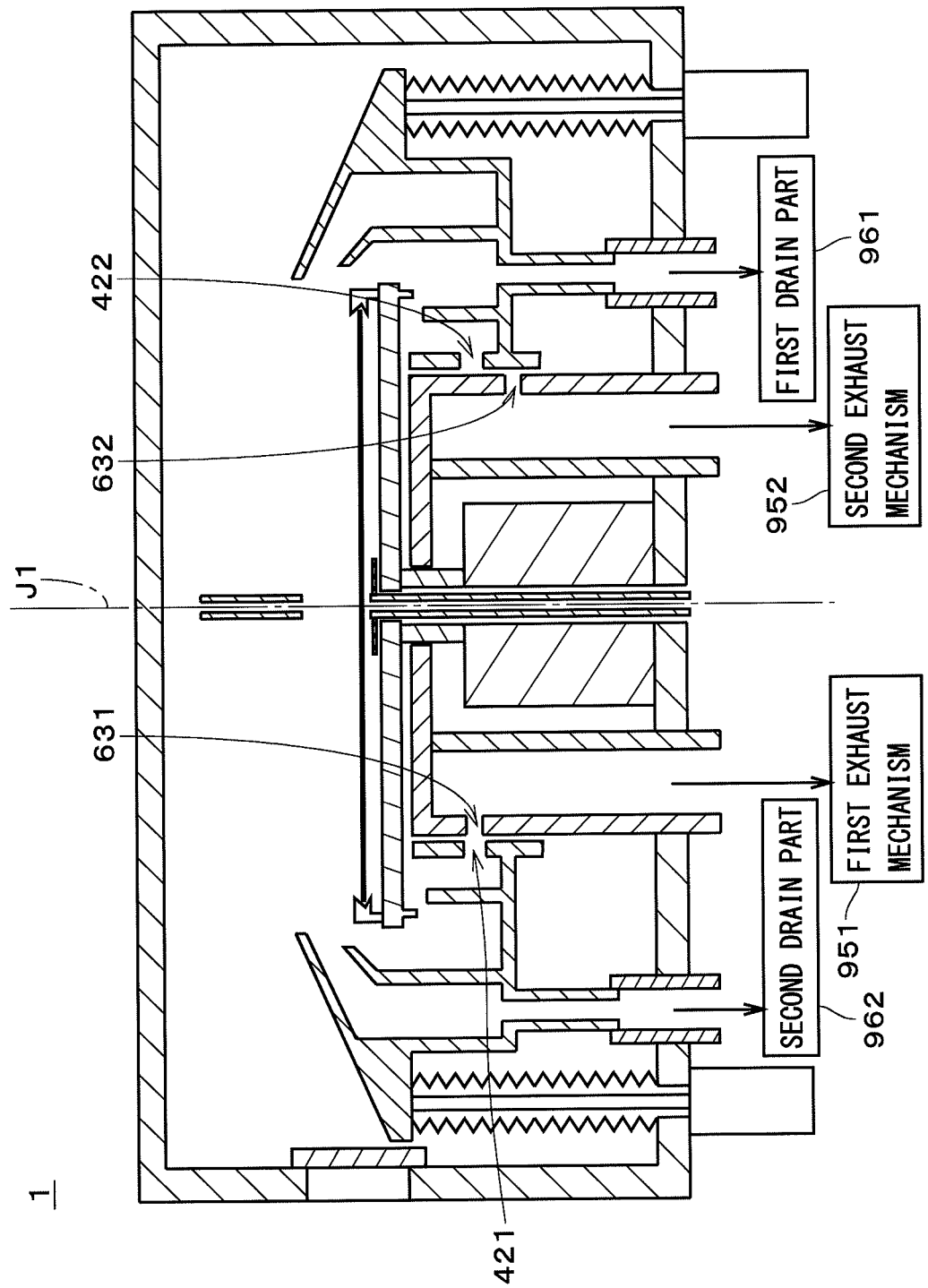
FIG. 23 is a longitudinal cross-sectional view of another substrate processing apparatus.

In the substrate processing apparatus 1 illustrated in FIG. 1, the first chamber exhaust port 631 and the second chamber exhaust port 632 do not necessarily have to be located at approximately the same position in the up-down direction. For example, as illustrated in FIG. 23, the second chamber exhaust port 632 may be provided below the first chamber exhaust port 631 in the chamber inner side-wall portion 63. In the example illustrated in FIG. 23, the first cup exhaust port 421 and the second cup exhaust port 422 are located at approximately the same position in the up-down direction.

The substrate processing apparatus 1a illustrated in FIG. 11 may have a single chamber exhaust port, instead of the large chamber exhaust port 634 and the small chamber exhaust port 635, and may change the area of overlap between the chamber exhaust port and the cup exhaust port 423 by moving the cup part 4 relative to the substrate holder 31 in the up-down direction while maintaining the overlap between the chamber exhaust port and the cup exhaust port 423. Even in this case, the flow rate of the gas exhausted from the chamber 6 can be easily changed. Besides, an increase in the size of the substrate processing apparatus 1a in the up-down direction can be suppressed because the distance of relative movement of the cup part 4, involved in changing the flow rate of the exhaust gas, is reduced.

The substrate processing apparatus 1b illustrated in FIG. 14 may have a single cup exhaust port, instead of the large cup exhaust port 424 and the small cup exhaust port 425, and may change the area of overlap between the chamber exhaust port 633 and the cup exhaust port by moving the cup part 4 relative to the substrate holder 31 in the up-down direction while maintaining the overlap between the cup exhaust port and the chamber exhaust port 633. Even in this case, the flow rate of the gas exhausted from the chamber 6 can be easily changed. Besides, an increase in the size of the substrate processing apparatus 1b in the up-down direction can be suppressed because the distance of relative movement of the cup part 4, involved in changing the flow rate of the exhaust gas, is reduced.

In the substrate processing apparatus 1 illustrated in FIG. 1, the first chamber exhaust port 631 and the second chamber exhaust port 632 do not necessarily have to be located at circumferential positions shifted by 180 degrees from each other. The relative circumferential positions of the first chamber exhaust port 631 and the second chamber exhaust port 632 may be appropriately changed. For example, the first chamber exhaust port 631 and the second chamber exhaust port 632 may be aligned in the up-down direction at the same circumferential position and may be connected respectively to the first duct 681 and the second duct 682. In this case, switching between the exhaust destinations can be easily performed if the cup inner side-wall portion 42 is provided with a single cup exhaust port, and this cup exhaust port is caused to selectively overlap the first chamber exhaust port 631 or the second chamber exhaust port 632. The same applies to the substrate processing apparatus 1c illustrated in FIG. 19.

In the substrate processing apparatus 1 illustrated in FIG. 1, the cup canopy portion 46 does not necessarily have to be an inclined portion, and may extend generally horizontally and radially inward from the upper end portion of the cup outer side-wall portion 45. The same applies to the substrate processing apparatuses 1a to 1e.

The cross-sectional shapes of the first cup exhaust port 421, the second cup exhaust port 422, the cup exhaust port 423, the large cup exhaust port 424, and the small cup exhaust port 425 may be generally rectangles whose each side is either parallel to or perpendicular to the up-down direction. Similarly, the cross-sectional shapes of the first chamber exhaust port 631, the second chamber exhaust port 632, the chamber exhaust port 633, the large chamber exhaust port 634, and the small chamber exhaust port 635 may be generally rectangles whose each side is either parallel to or perpendicular to the up-down direction. In this way, if each exhaust port has a generally rectangular cross-sectional shape, the area of overlap between the cup exhaust port and the chamber exhaust port will change linearly according to the distance of up-down movement of the cup part 4, 4a when the area of overlap is changed by slightly adjusting the position in the up-down direction of the cup part 4, 4a. Thus, the area of overlap between the cup exhaust port and the chamber exhaust port can be easily set to the desired area.

In the substrate processing apparatuses 1 and 1a to 1e, the structure of the cup elevating mechanism 7 may be modified in various ways. In the processing to be performed on the substrate 9, processing liquids may be supplied from the lower nozzle 52 to the lower surface of the substrate 9.

In the substrate processing apparatuses 1 and 1a to 1e, processing liquids flowing from the substrate 9 into the cup part may be discharged through common piping to the outside of the chamber and the housing, and switching between the discharge destinations may be performed using, for example, a valve outside the housing. Even in this case, an increase in the sizes of the substrate processing apparatuses 1 and 1a to 1e can be suppressed because such a valve and piping used with processing liquids are relatively compact.

The substrate processing apparatuses described above may be used to process glass substrates that are used in display devices such as liquid crystal displays, plasma displays, and field emission displays (FEDs), instead of being used to process semiconductor substrates. The substrate processing apparatuses described above may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST 1, 1a to 1e Substrate processing apparatus
4, 4a Cup part
5 Processing-liquid supply part
6 Chamber
7 Cup elevating mechanism
9 Substrate
10 Controller
31 Substrate holder
34 Protruding portion
41 Cup bottom portion
42 Cup inner side-wall portion
44 Cup intermediate wall portion
45 Cup outer side-wall portion
46 Cup canopy portion
47 Inner cup space
48 Outer cup space
61 Chamber bottom portion
311 Base portion
411 First cup drain port
412 Second cup drain port
413 Cup drain port
421, 421a First cup exhaust port
422, 422a Second cup exhaust port
423 Cup exhaust port
424 Large cup exhaust port
425 Small cup exhaust port
611 First chamber drain port
612 Second chamber drain port
613 Chamber drain port
631, 631a First chamber exhaust port
632, 632a Second chamber exhaust port
633 Chamber exhaust port
634 Large chamber exhaust port
635 Small chamber exhaust port
951 First exhaust mechanism
952 Second exhaust mechanism
953 Exhaust mechanism
961 First drain part
962 Second drain part
963 Drain part
J1 Central axis
S11 to S19 Step

The invention claimed is:

1. A substrate processing apparatus for processing a substrate, comprising:
a substrate holder for holding a substrate in a horizontal position;
a processing-liquid supply nozzle supplying a processing liquid to said substrate;
a cup part having a ring shape about a central axis pointing in an up-down direction, and for receiving a processing liquid from said substrate;
a chamber that houses therein said substrate holder and said cup part;
a cup elevator moving said cup part relative to said substrate holder in said up-down direction; and
a controller for causing said cup elevator to relatively move said cup part and determining relative positions of said cup part and said substrate holder,
wherein said cup part includes:
a circular ring-shaped cup bottom portion;
a tubular cup inner side-wall portion that extends upward from an inner peripheral portion of said cup bottom portion; and
a tubular cup outer side-wall portion that extends upward from an outer peripheral portion of said cup bottom portion,
a cup exhaust port is provided in said cup inner side-wall portion or said cup outer side-wall portion,
a first chamber exhaust port and a second chamber exhaust port are provided that oppose said cup inner side-wall portion on an inner side of said cup inner side-wall portion or oppose said cup outer side-wall portion on an outer side of said cup outer side-wall portion,
said controller causes said cup exhaust port to selectively overlap said first chamber exhaust port or said second chamber exhaust port by controlling said cup elevator,
in a state in which said cup exhaust port overlaps said first chamber exhaust port, gas in said cup part is exhausted through said cup exhaust port and said first chamber exhaust port to an outside of said chamber by a first exhaust mechanism that is connected to said first chamber exhaust port, and
in a state in which said cup exhaust port overlaps said second chamber exhaust port, gas in said cup part is exhausted through said cup exhaust port and said second chamber exhaust port to the outside of said chamber by a second exhaust mechanism that is connected to said second chamber exhaust port.

2. The substrate processing apparatus according to claim 1, wherein
said second chamber exhaust port is located at a circumferential position different from a circumferential position of said first chamber exhaust port, and
said cup exhaust port includes:
a first cup exhaust port that is located at the same circumferential position as the circumferential position of said first chamber exhaust port; and
a second cup exhaust port that is located at the same circumferential position as the circumferential position of said second chamber exhaust port.

3. A substrate processing apparatus for processing a substrate, comprising:
a substrate holder for holding a substrate in a horizontal position;
a processing-liquid supply nozzle supplying a processing liquid to said substrate;
a cup part having a ring shape about a central axis pointing in an up-down direction, and for receiving a processing liquid from said substrate;
a chamber that houses therein said substrate holder and said cup part;
a cup elevator moving said cup part relative to said substrate holder in said up-down direction; and a controller for causing said cup elevator to relatively move said cup part and determining relative positions of said cup part and said substrate holder, wherein said cup part includes:

a circular ring-shaped cup bottom portion;

a tubular cup inner side-wall portion that extends upward from an inner peripheral portion of said cup bottom portion; and a tubular cup outer side-wall portion that extends upward from an outer peripheral portion of said cup bottom portion, a cup exhaust port is provided in said cup inner side-wall portion or said cup outer side-wall portion, a chamber exhaust port is provided that opposes said cup inner side-wall portion on an inner side of said cup inner side-wall portion or opposes said cup outer side-wall portion on an outer side of said cup outer side-wall portion, in a state in which said cup exhaust port overlaps said chamber exhaust port, gas in said cup part is exhausted through said cup exhaust port and said chamber exhaust port to an outside of said chamber by an exhaust mechanism that is connected to said chamber exhaust port, and a flow rate of the gas exhausted from said chamber by said exhaust mechanism is changed by said controller controlling said cup elevator to change an area of overlap between said cup exhaust port and said chamber exhaust port.

4. The substrate processing apparatus according to claim 3, wherein said chamber exhaust port includes:

a large chamber exhaust port; and a small chamber exhaust port that is aligned in said up-down direction with said large chamber exhaust port and has a cross-sectional area smaller than a cross-sectional area of said large chamber exhaust port, and changing the area of overlap between said cup exhaust port and said chamber exhaust port is equivalent to causing said cup exhaust port to selectively overlap said large chamber exhaust port or said small chamber exhaust port.

5. The substrate processing apparatus according to claim 3, wherein said cup exhaust port includes:

a large cup exhaust port; and a small cup exhaust port that is aligned in said up-down direction with said large cup exhaust port and has a cross-sectional area smaller than a cross-sectional area of said large cup exhaust port, and changing the area of overlap between said cup exhaust port and said chamber exhaust port is equivalent to selectively causing said large cup exhaust port or said small cup exhaust port to overlap said chamber exhaust port.

6. The substrate processing apparatus according to claim 3, wherein changing the area of overlap between said cup exhaust port and said chamber exhaust port is implemented by moving said cup part relative to said substrate holder in said up-down direction while maintaining the overlap between said cup exhaust port and said chamber exhaust port.

7. The substrate processing apparatus according to claim 3, wherein said cup exhaust port is provided in said cup inner side-wall portion.

8. The substrate processing apparatus according to claim 3, wherein said substrate holder includes a holder body having a disc-like shape about said central axis, said cup part further includes a circular ring-shaped cup canopy portion that extends inward from an upper end portion of said cup outer side-wall portion, and during conveyance of a substrate into and out of the chamber, said controller controls said cup elevator to cause said holder body to be located at the same position in said up-down direction as a position of an inner peripheral portion of said cup canopy portion and in close proximity to said inner peripheral portion of said cup canopy portion.

9. The substrate processing apparatus according to claim 3, wherein said cup part further includes a tubular cup intermediate wall portion between said cup inner side-wall portion and said cup outer side-wall portion, the cup intermediate wall portion extending upward from said cup bottom portion, said cup bottom portion has:

a first cup drain port that is located inward of said cup intermediate wall portion; and a second cup drain port that is located outward of said cup intermediate wall portion, said first cup drain port is connected via a first chamber drain port to a first drain part that is disposed outside said chamber, the first chamber drain port being provided in a chamber bottom portion of said chamber, said second cup drain port is connected via a second chamber drain port to a second drain part that is disposed outside said chamber, the second chamber drain port being provided in said chamber bottom portion, said cup elevator moves said cup part between a first position that is determined based on said substrate holder and a second position that is below said first position, in a state in which said cup part is located at said first position, a processing liquid supplied from said processing-liquid supply nozzle to said substrate flows into a space between said cup inner side-wall portion and said cup intermediate wall portion of said cup part and is discharged to said first drain part, and in a state in which said cup part is located at said second position, a processing liquid supplied from said processing-liquid supply nozzle to said substrate flows into a space between said cup intermediate wall portion and said cup outer side-wall portion of said cup part and is discharged to said second drain part.

10. The substrate processing apparatus according to claim 3, wherein said substrate holder includes a holder body having a disc-like shape about said central axis, said holder body opposes said cup part in said up-down direction, above said cup part, and said holder body has a ring-shaped protruding portion that protrudes downward from a lower surface of said holder body and surrounds said central axis.

11. The substrate processing apparatus according to claim 3, wherein said chamber is an enclosed-space forming part that forms an enclosed space in which said substrate holder and said cup part are disposed.

12. The substrate processing apparatus according to claim 1, wherein said cup exhaust port is provided in said cup inner side-wall portion.

13. The substrate processing apparatus according to claim 1, wherein
said substrate holder includes a holder body having a disc-like shape about said central axis,
said cup part further includes a circular ring-shaped cup canopy portion that extends inward from an upper end portion of said cup outer side-wall portion, and
during conveyance of a substrate into and out of the chamber, said controller controls said cup elevator to cause said holder body to be located at the same position in said up-down direction as a position of an inner peripheral portion of said cup canopy portion and in close proximity to said inner peripheral portion of said cup canopy portion.

14. The substrate processing apparatus according to claim 1, wherein
said cup part further includes a tubular cup intermediate wall portion between said cup inner side-wall portion and said cup outer side-wall portion, the cup intermediate wall portion extending upward from said cup bottom portion,
said cup bottom portion has:
a first cup drain port that is located inward of said cup intermediate wall portion; and
a second cup drain port that is located outward of said cup intermediate wall portion, said first cup drain port is connected via a first chamber drain port to a first drain part that is disposed outside said chamber, the first chamber drain port being provided in a chamber bottom portion of said chamber,
said second cup drain port is connected via a second chamber drain port to a second drain part that is disposed outside said chamber, the second chamber drain port being provided in said chamber bottom portion,
said cup elevator moves said cup part between a first position that is determined based on said substrate holder and a second position that is below said first position,
in a state in which said cup part is located at said first position, a processing liquid supplied from said processing-liquid supply nozzle to said substrate flows into a space between said cup inner side-wall portion and said cup intermediate wall portion of said cup part and is discharged to said first drain part, and
in a state in which said cup part is located at said second position, a processing liquid supplied from said processing-liquid supply nozzle to said substrate flows into a space between said cup intermediate wall portion and said cup outer side-wall portion of said cup part and is discharged to said second drain part.

15. The substrate processing apparatus according to claim 1, wherein
said substrate holder includes a holder body having a disc-like shape about said central axis,
said holder body opposes said cup part in said up-down direction, above said cup part, and
said holder body has a ring-shaped protruding portion that protrudes downward from a lower surface of said holder body and surrounds said central axis.

16. The substrate processing apparatus according to claim 1, wherein said chamber is an enclosed-space forming part that forms an enclosed space in which said substrate holder and said cup part are disposed.

* * * * *